US012732290B2

(12) United States Patent
Dai et al.

(10) Patent No.: US 12,732,290 B2
(45) Date of Patent: Sep. 8, 2026

(54) METHOD FOR MEASURING NOISE RMS OF PERIODIC SIGNAL AND SIGNAL-TO-NOISE RATIO OF SINUSOIDAL SIGNAL

(71) Applicant: Nanjing University Of Posts And Telecommunications, Jiangsu (CN)

(72) Inventors: Erhan Dai, Jiangsu (CN); Zhi Weng, Jiangsu (CN); Linfei Su, Jiangsu (CN)

(73) Assignee: Nanjing University Of Posts And Telecommunications, Jiangsu (CN)

( * ) Notice: Subject to any disclaimer, the term of this patent is extended or adjusted under 35 U.S.C. 154(b) by 0 days.

(21) Appl. No.: 19/377,005

(22) Filed: Nov. 2, 2025

(65) Prior Publication Data

US 2026/0058741 A1 Feb. 26, 2026

Related U.S. Application Data

(62) Division of application No. 18/864,009, filed as application No. PCT/CN2022/127328 on Oct. 25, 2022.

(30) Foreign Application Priority Data

May 10, 2022 (CN) ........................ 202210505123.5
May 10, 2022 (CN) ........................ 202210505124.X

(51) Int. Cl.
*H04B 17/336* (2015.01)
*G01R 29/26* (2006.01)

(52) U.S. Cl.
CPC ........... *H04B 17/336* (2015.01); *G01R 29/26* (2013.01)

(58) Field of Classification Search
CPC ...... H04B 17/336; H04B 17/20; G01R 29/26; G01R 23/02
See application file for complete search history.

(56) References Cited

U.S. PATENT DOCUMENTS 6,735,538 B1 * 5/2004 Yamaguchi ............ G01R 29/26 702/69
2020/0412499 A1 * 12/2020 Wei ................... H04L 25/03159
2023/0401481 A1 * 12/2023 Cui ........................ G01R 23/02
2025/0030991 A1 * 1/2025 Monsen ............... H04R 25/453

FOREIGN PATENT DOCUMENTS

CN 104808055 B * 7/2017

* cited by examiner

*Primary Examiner* — William G Trost, IV
(74) *Attorney, Agent, or Firm* — JC ONE WORLD

(57) ABSTRACT

The present application relates to a method for measuring a Noise RMS of a periodic signal and a signal-to-noise ratio of a sinusoidal signal. The technical points of the method comprise: respectively executing signal noise measurement on a target periodic digital signal and a target periodic analog signal; obtaining a series of zero-crossing points of electrical signals, performing analog-to-digital conversion once at a relative time determined by means of the series of zero-crossing points; and further calculating the noise of the periodic signals by means of a series of analog-to-digital conversion results. The method further comprises: respectively executing signal-to-noise ratio measurement on a target sinusoidal digital signal and a target sinusoidal analog signal; obtaining a series of zero-crossing points of electrical signals; according to each zero-crossing point, calculating the frequency or period of the electric signal; and then performing calculation to obtain a signal-to-noise ratio of a sinusoidal signal.

8 Claims, 5 Drawing Sheets

METHOD FOR MEASURING NOISE RMS OF PERIODIC SIGNAL AND SIGNAL-TO-NOISE RATIO OF SINUSOIDAL SIGNAL

CROSS-REFERENCE TO RELATED APPLICATION

This application is a Divisional application of and claims the priority benefit of U.S. patent application Ser. No. 18/864,009, filed on Nov. 8, 2024, now pending. The prior U.S. patent application Ser. No. 18/864,009 is a 371 of international application of PCT application serial no. PCT/CN2022/127328, filed on Oct. 25, 2022, which claims the priority benefits of China application serial no. 202210505123.5, filed on May 10, 2022 and China application serial no. 202210505124.X, filed on May 10, 2022. The entirety of each of the above-mentioned patent applications is hereby incorporated by reference herein and made a part of this specification.

TECHNICAL FIELD

The present disclosure belongs to a technical field of signal noise measurement, and specifically relates to a method for measuring a Noise RMS of a periodic signal and a signal-to-noise ratio of a sinusoidal signal.

BACKGROUND

In actual applications, the device receives useful signals that acquire to be processed by the device, as well as the irregular noises that do not exist in the useful signals. When the device receives signals, also noises are received. These noises can be signals of an arbitrary period, including sinusoidal signals or periodic signals with harmonics. When the frequency and amplitude of noise reach a certain level, the unused signals are submerged, making the useful signals difficult to be demodulated, causing the device can not transmit information clearly and accurately. In order to reduce the interference of noises, the noises in the signals are acquired to be detected in real time, and the corresponding adjustments are required to be made according to the current noise situation. Since the existence of harmonics, the noise measurements of the periodic signals are a field without relatively accurate measurement result at present. Similarly, in the received signals, the ratio of the useful signal power to the interfering noise power is called as the signal-to-noise ratio (SNR). The useful signal power and noise power are measured by the valid values for all samples of the received signal series and noise series, respectively. The signal-to-noise ratio is an important parameter that can be measured in real time and can reflect the characteristics of the system in real time, and is an important indicator for measuring the performance for a receiver. However, no real-time and accurate process for measuring the signal-to-noise ratio of high-frequency sinusoidal signals exists in prior art.

SUMMARY OF INVENTION

The technical problems to be solved by the present disclosure are to provide a method for measuring a Noise RMS of a periodic signal and a signal-to-noise ratio of a sinusoidal signal. By using a new strategy, the method can solve the problems of insufficient measurement accuracy of the Noise RMS of periodic digital signal and the signal-to-noise ratio in the prior art, or the disadvantages of excessive calculation amount during the measurement process, and can improve the measurement efficiency of the Noise RMS for the signal.

The exemplary embodiments of the present disclosure adopt the following technical solutions to solve the above technical problems:

According to one aspect of the present disclosure, the exemplary embodiments of the present disclosure designs a method for measuring a Noise RMS of a periodic signal, used to obtain a noise of the target periodic signal. The target periodic signal is a target periodic digital signal, and the method includes the following steps:

In Step A, the target periodic signal is sampled to obtain a sampled signal, and then Step B is entered.

In Step B, a continuous zero-crossing time series $T_{z1}, \ldots, T_{zk}, \ldots, T_{zK}$ of at least two periods on the sampled signal after passing a negative peak value or a positive peak values is obtained through an analog means or a digital means, wherein K denotes the number of zero-crossing time instants in the continuous zero-crossing time series, and $T_{zk}$ denotes the k-th zero-crossing time instant in the continuous zero-crossing time series; and then j=K+1 is initialized and Step C is entered.

In Step C, an average period T is calculated and obtained according to $T_{z(j-1)}, \ldots, T_{z(j-m)}$, and further a digital initial integration point time instant $T_{sj}$ corresponding to a j-th zero-crossing time instant is calculated and obtained according to a preset parameter c that satisfies a value range (0.5, 1) through $T_{sj}=T_{z(j-1)}+T\times c$, and then Step D is entered, wherein $1<m<j$, and $T_{zj}$ denotes the j-th zero-crossing time instant.

In Step D, two sampling points that are adjacent front and back to the digital initial integration point time instant $T_{sj}$ are selected on the basis of each sampling point on the sampling signal, and the first sampling point to be analyzed, and the second sampling point to be analyzed are sequentially formed. A coordinate of the sampling point to be analyzed is formed by combining a time instant corresponding to the sampling point and a sampling value corresponding to the sampling point, and then Step E is entered.

In Step E, a sampling value $x_{sj}$ corresponding to $T_{sj}$ and at a position between the first sampling point and the second sampling point is obtained through a rectangular interpolation means or a trapezoidal interpolation means according to the digital initial integration point time instant $T_{sj}$, to form a coordinate $(T_{sj}, x_{sj})$ of a digital integration starting point, and then v=2 is initialized, each sampling points after the first sampling point and the second sampling point on the sampling signal as the sampling point to be analyzed are sequentially defined, and Step F is entered.

In Step F, a digital integration operation on the sampling signal from a coordinate position of the digital integration starting point to a coordinate position of the v-th sampling point to be analyzed is executed to form a digital integration result Sy; and a digital integration operation on the sampling signal from a coordinate position of the digital integration starting point to a coordinate position of the v+1-th sampling point to be analyzed is executed to form a digital integration result $S_{v+}1$, and then Step G is entered.

In Step G, whether a product of the digital integration result $S_v$ and the digital integration result $S_{v+}1$ is greater than 0 is determined, in a case of yes, a value for v is updated by adding 1 and Step F is returned to; otherwise, Step H is entered.

In Step H, a coordinate $(T_{ej}, x_{ej})$ of an digital integration ending point located between the v-th sampling point to be analyzed and the v+1-th sampling point to be analyzed is obtained according to a condition that a sum of a digital integration from the digital integration starting point to an digital integration ending point is zero, through the rectangular interpolation means or the trapezoidal interpolation means, and then Step I is entered.

In Step I, the j-th zero-crossing time instant $T_{zj}$ is obtained according to $$T_{zj} = \frac{T_{sj} + T_{ej}}{2},$$

and then Step J is entered.

In Step J, following steps are executed on the zero-crossing time instant $T_{zj}$, according to a preset time constant $T_C$ that is not greater than a period value for the target periodic signal. A signal voltage value $V_j$ at a time instant $T_{zj}+T_C$ is obtained, a signal voltage value series $\{V_{K+1}, \ldots, V_j\}$ is constructed or updated, and then Step K is entered;

Steps: a signal voltage value $V_j$ corresponding to a time instant $T_{zj}+T_C$ position on the target periodic signal after an analog-to-digital conversion is obtained; or a signal voltage value $V_j$ corresponding to a sampled time instant $T_{zj}+T_C$ position on the target periodic signal after the analog-to-digital conversion is obtained; or a signal voltage value $V_j$ corresponding to a time instant position adjacent to and closest to a time instant $T_{zj}+T_C$ position on the target periodic signal after an analog-to-digital conversion is obtained; or a signal voltage value $V_j$ at the time instant $T_{zj}+T_C$ position is obtained by selecting signal voltage values corresponding to an adjacent time instant positions respectively on both sides of a time instant $T_{zj}+T_C$ position on the target periodic signal after the analog-to-digital conversion, through a linear interpolation.

In Step K, whether a length of the signal voltage value series $\{V_{K+1}, \ldots, V_j\}$ is less than a preset threshold n is determined, in a case of yes, Step L is entered; otherwise, latest generated n signal voltage values from the signal voltage value series $\{V_{K+1}, \ldots, V_j\}$ is selected, and through a following formula:

$$v_{noisePower,j} = \sqrt{\frac{\sum_{l=j-(n-1)}^{j} \left(V_1 - \overline{V}\right)^2}{n}}$$

a target periodic signal noise $V_{noisePower,j}$ is obtained, wherein $\overline{V}$ denotes an average voltage value for the n signal voltage values that are selected to participate in a calculation, and then Step L is entered.

In Step L, a value for j is updated by adding 1, and Step C is returned to.

In one embodiment, in Step C, according to $T_{z(j-1)}, \ldots, T_{z(j-m)}$, the average period T is calculated and obtained through $$T = \frac{T_{z(j-1)} - T_{z(j-m)}}{m-1}.$$

In one embodiment, in Step A, the target periodic signal is sampled by adopting an equal time interval sampling means or an unequal time interval sampling means to obtain the sampled signal.

In one embodiment, in Step A, a whole period sampling is executed on the target periodic signal to obtain the sampled signal.

In one embodiment, in Step F, the digital integration operation is either a trapezoidal integration or a rectangular integration.

According to another aspect of the present disclosure, the exemplary embodiments of the present disclosure design a method for measuring a Noise RMS of a periodic signal, used to obtain a noise of the target periodic signal. The target periodic signal is a target periodic analog signal, and the method includes the following steps:

In Step i, a continuous zero-crossing time series $T_{z1}, \ldots, T_{zk}, \ldots, T_{zK}$ of at least two periods on the sampled signal after passing a negative peak value or a positive peak values is obtained through an analog means or a digital means, wherein K denotes the number of zero-crossing time instants in the continuous zero-crossing time series, and $T_{zk}$ denotes the k-th zero-crossing time instant in the continuous zero-crossing time series; and then j=K+1 is initialized and Step ii is entered.

In Step ii, an average period T is calculated and obtained according to $T_{z(j-1)}, \ldots, T_{z(j-m)}$, and further a digital initial integration point time $T_{sj}$ corresponding to the j-th zero-crossing time instant $T_{zj}$ is calculated and obtained according to a preset parameter c that satisfies a value range (0.5, 1), through $T_{sj}=T_{z(j-1)}+T\times C$, and then Step iii is entered, wherein 1<m<j, and $T_{zj}$ denotes the j-th zero-crossing time instant.

In Step iii, an integrator is initialized before the time instant $T_{sj}$ to return an integrator output voltage to zero, and an analog integration is started at a digital integration starting point time instant $T_{sj}$, in a case wherein the integrator output voltage returns to zero again, the integration is terminated and an integration ending point time instant $T_{ej}$ is recorded, and then Step iv is entered.

In Step iv, the j-th zero-crossing time instant $T_{zj}$ is obtained according to $$T_{zj} = \frac{T_{sj} + T_{ej}}{2},$$

and then Step v is entered.

In Step v, following steps are executed on the zero-crossing time instant $T_{zj}$ according to a preset time constant $T_C$ that is not greater than a period value for the target periodic signal, a signal voltage value $V_j$ at a time instant $T_{zj}+T_C$ is obtained, a signal voltage value series $\{V_{K+1}, \ldots, V_j\}$ is constructed or updated and then Step vi is entered.

Steps: a signal voltage value V corresponding to a time instant $T_{zj}+T_C$ position on the target periodic signal for an analog-to-digital conversion is obtained; or a signal voltage value $V_j$ corresponding to a sampled time instant $T_{zj}+T_C$ position on the target periodic signal after the analog-to-digital conversion is obtained; or a signal voltage value $V_j$ corresponding to a time instant position adjacent to and closest to a time instant $T_{zj}+T_C$ position on the target periodic signal after an analog-to-digital conversion is obtained; or a signal voltage value $V_j$ at the time instant $T_{zj}+T_C$ position is obtained by selecting signal voltage values corresponding to an adjacent time instant positions respectively on both sides of a time instant $T_{zj}+T_C$ position on the target periodic signal after the analog-to-digital conversion, through a linear interpolation.

In Step vi, whether a length of the signal voltage value series $\{V_{K+1}, \ldots, V_j\}$ is less than a preset threshold n is determined, in a case of yes, Step vii is entered; otherwise, latest generated n signal voltage values are selected from the signal voltage value series $\{V_{K+1}, \ldots, V_j\}$, and through a following formula:

$$V_{noisePower,j} = \sqrt{\frac{\sum_{1=j-(n-1)}^{j}(V_1 - \bar{V})^2}{n}}$$

A target periodic signal noise $V_{noisePower\,j}$ is obtained, wherein $\bar{V}$ denotes an average voltage value for the n signal voltage values that are selected to participate in a calculation, and then Step vii is entered.

In Step vii, a value for j is updated by adding 1, and Step ii is returned to.

In one embodiment, in Step ii, according to $T_{z(j-1)}, \ldots, T_{z(j-m)}$, the average period T is calculated and obtained through $$T = \frac{T_{z(j-1)} - T_{z(j-m)}}{m-1}.$$

In one embodiment, after respectively obtaining the digital integration starting point time instant $T_{sj}$ and the digital integration ending point time instant $T_{ej}$, $T_{sj}$ and $T_{ej}$ are respectively calibrated and updated according to circuit delay parameters.

In one embodiment, in Step iii, the analog integration is implemented by utilizing an operational amplifier or other devices with integration functions.

According to another aspect of the present disclosure, the exemplary embodiments of the present disclosure design a method for measuring a signal-to-noise ratio of a sinusoidal signal, used to obtain a signal-to-noise ratio of a target sinusoidal signal. The target sinusoidal signal is a target sine digital signal, and the method includes the following steps:

In Step A', the target periodic signal is sampled to obtain a sampled signal, and then step B' is entered.

In Step B', a continuous zero-crossing time series $T_{z1}, \ldots, T_{zk}, \ldots, T_{zK}$ of at least two periods on the sampled signal after passing a negative peak value or a positive peak value is obtained through an analog means or a digital means, wherein K denotes the number of zero-crossing time instants in the continuous zero-crossing time series, and $T_{zk}$ denotes the k-th zero-crossing time instant in the continuous zero-crossing time series; and then j=K+1 is initialized and Step C' is entered.

In Step C', an average period T is calculated and obtained according to $T_{z(j-1)}, \ldots, T_{z(j-m)}$, and further a digital initial integration point time instant $T_{sj}$ corresponding to the j-th zero-crossing time instant $T_{zj}$ is calculated and obtained according to a preset parameter c that satisfies a value range (0.5, 1), through $T_{sj}=T_{z(j-1)}+T\times c$, and then Step D' is entered, wherein, 1<m<j, and $T_{zj}$ denotes the j-th zero-crossing time instant.

In Step D', two sampling points that are adjacent front and back to the digital initial integration point time instant $T_{sj}$ are selected on the basis of each sampling point on the sampling signal, and the first sampling point to be analyzed, and the second sampling point to be analyzed are sequentially formed, a coordinate of the sampling point to be analyzed is formed by combining a time instant corresponding to the sampling point and a sampling value corresponding to the sampling point, and then Step E' is entered.

In Step E', a sampling value $x_{sj}$ corresponding to $T_{sj}$ and at a position between the first sampling point and the second sampling point are obtained according to the digital initial integration point time instant $T_{sj}$, through a rectangular interpolation means or a trapezoidal interpolation means, to form a coordinate $(T_{sj}, x_{sj})$ of a digital integration starting point, and then v=2 is initialized, each sampling point after the first sampling point and the second sampling point on the sampling signal is sequentially defined as each sampling point to be analyzed, and Step F' is entered.

In Step F', a digital integration operation on the sampling signal from a coordinate position of the digital integration starting point to a coordinate position of the v-th sampling point to be analyzed is executed to form a digital integration result Sy; and a digital integration operation on the sampling signal from a coordinate position of the digital integration starting point to a coordinate position of the v+1-th sampling point to be analyzed is executed to form a digital integration result $S_{v+}1$, and then Step G' is entered.

In Step G', whether a product of the digital integration result $S_v$ and the digital integration result $S_{v+}1$ is greater than 0 is determined, in a case of yes, a value for v is updated by adding 1 and Step F' is returned to; otherwise, Step H' is entered.

In Step H', a coordinate $(T_{ej}, x_{ej})$ of an digital integration ending point located between the v-th sampling point to be analyzed and the v+1-th sampling point to be analyzed is obtained according to a condition that a sum of a digital integration from the digital integration starting point to an digital integration ending point is zero, through the rectangular interpolation means or the trapezoidal interpolation means, and then Step I' is entered.

In Step I', the j-th zero-crossing time instant $T_{zj}$ is obtained according to $$T_{zj} = \frac{T_{sj} + T_{ej}}{2},$$

further, an integration time duration $T_{tj}$ corresponding to the j-th zero-crossing time instant $T_{zj}$ is obtained according to $T_{tj}=T_{ej}-T_{sj}$, and an integration time instant $T_{tj}$ corresponding to the j-th target zero-crossing time instant $T_{zj}$ is formed, and then Step J' is entered.

In Step J', a measured signal period is obtained according to the target zero-crossing time instant $T_{zj}$, through $T_{p(j-1)}=T_{zj}-T_{z(j-1)}$, a tested signal frequency is obtained through $$F_{(j-1)} = \frac{1}{T_{p(j-1)}} = \frac{1}{T_{zj} - T_{z(j-1)}},$$

and then Step K' is entered.

In Step K', whether a length of a signal zero-crossing time series $\{T_{z(K+1)}, \ldots, T_{zj}\}$ is less than a preset threshold w+1 is determined, in case of yes, Step N' is entered; otherwise, a following calculation is performed: w latest generated integration time durations are selected from the signal integration time duration series $\{T_{t(K+1)}, \ldots, T_{tj}\}$, an average integration time duration $T_{ta}$ is calculated and acquired, and the average integration time duration $T_{ta}$ is converted into a count value n corresponding to a sampling period multiple; w latest generated signal periods are selected from a signal period series $\{T_{p(K+1)}, \ldots, T_{p(j-1)}\}$, an average period value $T_{pa}$ is calculated and acquired, the average period value $T_{pa}$ is converted into a count value N corresponding to the sampling period multiple, and then Step L' is entered.

In Step L', a period standard deviation $\sigma_T$ is calculated and obtained according to the w latest generated signal periods selected from the signal period series $\{T_{p(K+1)}, \ldots, T_{p(j-1)}\}$, and a parameter $\sigma_R$ is obtained through $$\sigma_R = \frac{\sigma_T}{T_{pa}};$$

or, a frequency standard deviation $\sigma_F$ is calculated and obtained according to w latest generated signal frequencies selected from a signal frequency series $\{F_{(K+1)}, \ldots, F_{(j-1)}\}$, a parameter $\sigma_R$ is obtained through $$\sigma_R = \frac{\sigma_F}{1/T_{pa}},$$

and then step M' is entered.

In Step M', a signal-to-noise ratio SNR of the target sinusoidal signal is calculated and $$SNR = \frac{A^2}{2\sigma^2},$$

obtained according to count values n and N, as well as the parameter $\sigma_R$, through wherein A denotes a peak value for the sinusoidal signal and $\sigma$ denotes a Noise RMS for the signal, and then Step N' is entered.

In Step N', a value for j is updated by adding 1, and Step C' is returned to.

In one embodiment, in Step C', according to $T_{z(j-1)}, \ldots, T_{z(j-m)}$, the average period T is calculated and obtained through $$T = \frac{T_{z(j-1)} - T_{z(j-m)}}{m-1}.$$

In one embodiment, in Step A', the target periodic signal is sampled by adopting an equal time interval sampling means or an unequal time interval sampling means to obtain the sampled signal; and a whole period sampling is executed on the target periodic signal to obtain the sampled signal.

In one embodiment, in Step F', the digital integration operation is either a trapezoidal integration or a rectangular integration.

In one embodiment, in Step M', according to count values n and N, as well as the parameter $\sigma_R$, through $$SNR = \frac{A^2}{2\sigma^2}$$

follows an arbitrary of following four formulas:

$$SNR = \frac{A^2}{2\sigma^2} = \frac{n}{\left\{2 \times \sigma_R \times N \times \sin\left[\frac{n}{N} \times \pi\right]\right\}^2}$$

-continued $$SNR = \frac{A^2}{2\sigma^2} = \frac{N \times 2 \times (1-c)}{\left\{2 \times \sigma_R \times N \times \sin\left[\frac{n}{N} \times \pi\right]\right\}^2}$$

$$SNR = \frac{A^2}{2\sigma^2} = \frac{n}{\{2 \times \sigma_R \times N \times \sin[2 \times (1-c) \times \pi]\}^2}$$

$$SNR = \frac{A^2}{2\sigma^2} = \frac{N \times 2 \times (1-c)}{\{2 \times \sigma_R \times N \times \sin[2 \times (1-c) \times \pi]\}^2}$$

calculating and obtaining a signal-to-noise ratio SNR of the target sinusoidal signal.

According to another aspect of the present disclosure, the exemplary embodiments of the present disclosure design a method for measuring a signal-to-noise ratio of a sinusoidal signal, used to obtain a signal-to-noise ratio of a target sinusoidal signal. The target sinusoidal signal is a target sinusoidal analog signal, and the method includes the following steps:

In Step i', a continuous zero-crossing time series $T_{z1}, \ldots, T_{zk}, \ldots, T_{zK}$ of at least two periods on the sampled signal after passing a negative peak value or a positive peak value is obtained through an analog means or a digital means, wherein K denotes the number of zero-crossing time instants in the continuous zero-crossing time series, and $T_{zk}$ denotes the k-th zero-crossing time instant in the continuous zero-crossing time series; and then j=K+1 is initialized and Step ii' is entered.

In Step ii', an average period T is calculated and obtained according to $T_{z(j-1)}, \ldots, T_{z(j-m)}$, and a digital initial integration point time instant $T_{sj}$ corresponding to the j-th zero-crossing time instant is further calculated and obtained according to a preset parameter c that satisfies a value range (0.5, 1), through $T_{sj}=T_{z(j-1)}+T\times c$, and then Step iii' is entered, wherein $1<m<j$, and $T_{zj}$ denotes the j-th zero-crossing time instant.

In Step iii', an integrator is initialized before the time instant $T_{sj}$, to return an integrator output voltage to zero, and an analog integration is started at a digital integration starting point time instant $T_{sj}$, in a case wherein the integrator output voltage returns to zero again, the integration is terminated, and an integration ending point time instant $T_{ej}$ is recorded, and then Step iv' is entered.

In Step iv', the j-th zero-crossing time instant $T_{zj}$ is obtained according to $$T_{zj} = \frac{T_{sj} + T_{ej}}{2},$$

and further an integration point time duration $T_{tj}$ corresponding to the j-th zero-crossing time instant $T_{zj}$ is obtained according to $T_{tj}=T_{ej}-T_{sj}$, to form an integration time duration $T_{ej}$ corresponding to a j-th target zero-crossing time instant $T_{zj}$, and then Step v' is entered.

In Step v', a measured signal period is obtained according to the target zero-crossing time instant $T_{zj}$, through $T_{p(j-1)}=T_{zj}-T_{z(j-1)}$, a tested signal frequency is obtained through $$F_{(j-1)} = \frac{1}{T_{p(j-1)}} = \frac{1}{T_{zj} - T_{z(j-1)}},$$

and then Step vi' is entered.

In Step vi', whether a length of a signal zero-crossing time series $\{T_{z(K+1)}, \ldots, T_{zj}\}$ is less than a preset threshold w+1 is determined, in case of yes, Step ix' is entered; otherwise, the following calculation is performed. w latest generated integration time durations are selected from the signal integration time duration series $\{T_{t(K+1)}, \ldots, T_{tj}\}$, an average integration time duration $T_{ta}$ is calculated and obtained, and the average integration time duration $T_{ta}$ is converted into a count value n corresponding to a counter period multiple; w latest generated signal periods are selected from a signal period series $\{T_{p(K+1)}, \ldots, T_{p(j-1)}\}$, an average period value $T_{pa}$ is calculated and obtained, the average period value $T_{pa}$ is converted into a count value N corresponding to the counter period multiple, and then Step vii' is entered.

In Step vii', a period standard deviation σT is calculated and obtained according to the w latest generated signal periods selected from the signal period series $\{T_{p(K+1)}, \ldots, T_{p(j-1)}\}$, and a parameter $\sigma_R$ is obtained through $$\sigma_R = \frac{\sigma_T}{T_{pa}};$$

or, a frequency standard deviation $\sigma_F$ is calculated and obtained according to w latest generated signal frequencies selected from a signal frequency series $\{F_{(K+1)}, \ldots, F_{(j-1)}\}$, a parameter $\sigma_R$ is obtained through $$\sigma_R = \frac{\sigma_F}{1/T_{pa}},$$

and then Step viii' is entered.

In Step viii', a signal-to-noise ratio SNR of the target sinusoidal signal is calculated and obtained according to count values n and N, as well as the parameter $\sigma_R$, through $$SNR = \frac{A^2}{2\sigma^2},$$

wherein A denotes a peak value for the sinusoidal signal and σ denotes a Noise RMS for the signal, and then Step ix' is entered.

In Step ix', a value for j is updated by adding 1, and Step ii' is returned to.

In one embodiment, according to $T_{z(j-1)}, \ldots, T_{z(j-m)}$, the average period T is calculated and obtained through $$T = \frac{T_{z(j-1)} - T_{z(j-m)}}{m-1}.$$

In one embodiment, after respectively obtaining the digital integration starting point time instant $T_{sj}$ and the digital integration ending point time instant $T_{ej}$, $T_{sj}$ and $T_{ej}$ are respectively calibrated and updated according to circuit delay parameters.

In one embodiment, in Step viii', according to count values n and N, as well as the parameter $\sigma_R$, through $$SNR = \frac{A^2}{2\sigma^2}$$

follows an arbitrary of following four formulas:

$$SNR = \frac{A^2}{2\sigma^2} = \frac{n}{\left\{2 \times \sigma_R \times N \times \sin\left[\frac{n}{N} \times \pi\right]\right\}^2}$$

$$SNR = \frac{A^2}{2\sigma^2} = \frac{N \times 2 \times (1-c)}{\left\{2 \times \sigma_R \times N \times \sin\left[\frac{n}{N} \times \pi\right]\right\}^2}$$

$$NR = \frac{A^2}{2\sigma^2} = \frac{n}{\{2 \times \sigma_R \times N \times \sin[2 \times (1-c) \times \pi]\}^2}$$

$$SNR = \frac{A^2}{2\sigma^2} = \frac{N \times 2 \times (1-c)}{\{2 \times \sigma_R \times N \times \sin[2 \times (1-c) \times \pi]\}^2}$$

calculating and obtaining a signal-to-noise ratio SNR of the target sinusoidal signal.

In one embodiment, in Step iii', the analog integration is implemented by utilizing an operational amplifier or other devices with integration functions.

In comparison with the prior art, the technical solutions of the present disclosure have following technical effects.

1. The traditional zero-crossing means utilizes two consecutive points with opposite symbols to determine the zero-crossing point, whose algorithm has a clear physical concept, but the means is easy to be interfered by harmonics, noises and the like, and the measurement accuracy is low. The method for measuring the Noise RMS for the periodic signal designed by the present disclosure, in view of the characteristic that most of the digital signals in the target period are symmetrical, according to the calculated integration starting time instant, performs a linear interpolation operation to select a sampling point Ps as the integration starting point; then, performs a digital integration to obtain an integration ending point through interpolation, thus the digital integration from the integration starting point to the integration ending point is zero; calculates the zero point of the electrical signal from the sampling occurrence time instant of the integration starting point and the virtual occurrence time instant of the integration ending point; further calculates Noise RMS for the electrical signal after the analog-to-digital conversion and greatly improves the accuracy of the corresponding noise measurement.

2. The method for measuring the Noise RMS for the periodic signal designed by the present disclosure, in view of the characteristic of the target periodic analog signals, simulates integration according to the calculated integration starting time instant. When the simulated integration output reaches zero, the integration is terminated. The zero point of the electrical signal is calculated from the integration starting time instant and integration ending time instant. After analog-to-digital conversion, the Noise RMS for the electrical signal can be further calculated, and the accuracy of the corresponding noise measurement is greatly improved. The design method is extremely convenient and simple during the calculation, suitable for use in embedded systems, simple and reasonable for implementation, accurate and reliable in data, and has a wide range of application prospects.

3. In the method for measuring the signal-to-noise ratio of sinusoidal signals designed by the present disclosure, in view of the characteristics that most target sinusoidal digital signals are symmetrical, the linear interpolation is calculated according to the calculated integration starting time instant, and a sampling point Ps is selected as the integration starting point, then, the digital integration is performed to obtain an integration ending point through interpolation, so that the digital integration from the integration starting point to the integration ending point is zero, the zero point of the electrical signal is calculated from the sampling occurrence time instant of the integration starting point and the virtual occurrence time instant of the integration ending point, the frequency and period of the electrical signal can be calculated after determining the zero crossing point of the signal, and the signal-to-noise ratio of the sinusoidal signal can be further calculated.

4. In the method for measuring the signal-to-noise ratio of sinusoidal signals designed by the present disclosure, in view of the characteristics that the target sinusoidal analog signal is vertically symmetry, the analog integration is performed according to the calculated integration starting time instant. When the analog integration output reaches zero, the integration is terminated. The zero point of the electrical signal is calculated from the integration starting time instant and integration ending time instant. After determining the zero crossing point of the signal, the frequency and period of the electrical signal can be calculated, and the signal-to-noise ratio of the sinusoidal signal can be further calculated. The accuracy of the corresponding signal-to-noise ratio measurement is greatly improved accordingly. The design method is extremely convenient and simple for calculation, and is suitable for use in embedded systems.

DESCRIPTION OF EMBODIMENTS

Figure 1:
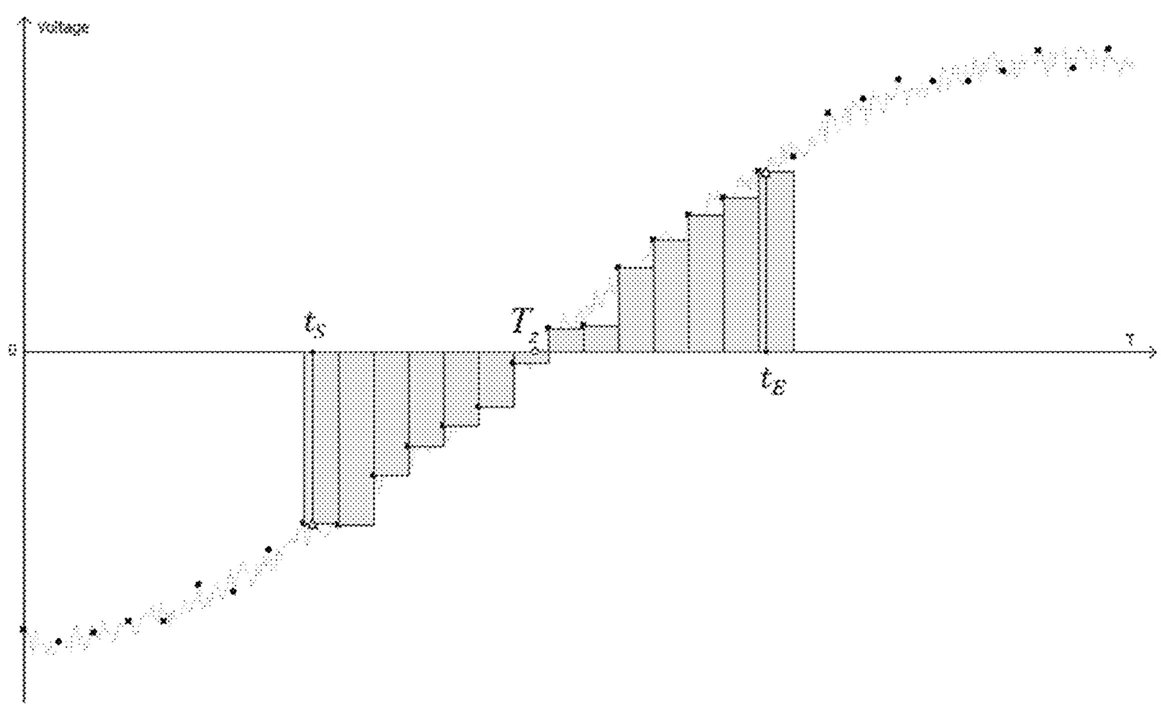
FIG. 1 illustrates a schematic diagram of calculating and obtaining a virtual occurrence time instant of an integration ending point by utilizing a rectangular integration and a rectangular interpolation, and acquiring a zero crossing point, after calculating and acquiring the integration starting point, in one embodiment of the present disclosure.

Exemplary embodiments are described more fully with reference to the accompanying drawings. However, the exemplary embodiments can be implemented in a variety of forms and should not be construed as being limited to the embodiments set forth herein. Rather, these embodiments are provided so that the disclosure are thorough and complete, and fully convey the concepts of the exemplary embodiments to those person skilled in the art. The same reference numerals in the drawings denote the same or similar parts, and thus their repeated description will be omitted.

The described features, structures, or characteristics may be combined in an arbitrary suitable manner in one or more embodiments. In the following description, numerous specific details are provided to give a thorough understanding of the embodiments of the present disclosure. However, those person skilled in the art would be aware that the technical solutions of the present disclosure may be practiced without one or more of these specific details, or other manners, components, materials, apparatuses or operations may be used. In these instances, well-known structures, methods, apparatuses, implementations, materials, or operations will not be shown or described in detail.

The flowcharts as illustrated in the accompanying drawings are merely exemplary descriptions, do not necessarily include all contents and operations or steps, and are not necessarily performed in the described order. For exemplary, some operations or steps may also be decomposed, and the operations or steps may be combined or partially combined, so the actual execution order may be changed according to actual situations.

Specific implementations of the present disclosure are further described in detail below with reference to the accompanying drawings of the specification.

Designed by the present disclosure is a method for measuring a Noise RMS of a periodic signal, which is designed to obtain noise of a target periodic signal for a target periodic digital signal and a target periodic analog signal, respectively. The following Step A to Step L are designed and executed on the target periodic digital signal, to obtain noise of the target periodic digital signal.

In Step A, an equal time interval sampling means or an unequal time interval sampling means is adopted, to perform a full-period sampling on the target periodic signal to obtain a sampling signal, and then Step B is entered.

In Step B, a continuous zero-crossing time series $T_{z1}, \ldots, T_{zk}> \ldots, T_{zK}$ of at least two periods on the sampled signal after passing a negative peak value or a positive peak values is obtained through an analog means or a digital means, wherein K denotes the number of zero-crossing time instants in the continuous zero-crossing time series, and $T_{zk}$ denotes the k-th zero-crossing time instant in the continuous zero-crossing time series; and then j=K+1 is initialized and Step C is entered.

In Step C, an average period T is calculated and obtained according to $T_{z(j-1)}, \ldots, T_{z(j-m)}$, and further a digital initial integration point time instant $T_{sj}$ corresponding to the j-th zero-crossing time instant is calculated and obtained according to a preset parameter c that satisfies a value range (0.5, 1) through $T_{sj}=T_{z(j-1)}+T\times c$, and then Step D is entered, wherein 1<m<j, and $T_{zj}$ denotes the j-th zero-crossing time instant. The average period T is calculated and obtained according to $T_{z(j-1)}, \ldots, T_{z(j-m)}$, through $$T = \frac{T_{z(j-1)} - T_{z(j-m)}}{m-1}.$$

With regard to the value for the preset parameter c, c is not suitable to be too close to 1, and in a case wherein c is close to 1, the calculation time is shortened, which affects the accuracy of noise measurement.

In Step D, two sampling points that are adjacent front and back to the digital initial integration point time instant $T_{sj}$ are selected on the basis of each sampling point on the sampling signal, and the first sampling point to be analyzed, and the second sampling point to be analyzed are sequentially formed. A coordinate of the sampling point to be analyzed is formed by combining a time instant corresponding to the sampling point and a sampling value corresponding to the sampling point, and then Step E is entered.

In Step E, a sampling value $x_{sj}$ corresponding to $T_{sj}$ and at a position between the first sampling point and the second sampling point is obtained through a rectangular interpolation means or a trapezoidal interpolation means according to the digital initial integration point time instant $T_{sj}$, to form a coordinate $(T_{sj}, x_{sj})$ of a digital integration starting point, and then v=2 is initialized, each sampling points after the first sampling point and the second sampling point on the sampling signal as the sampling point to be analyzed are sequentially defined, and Step F is entered.

In Step F, a digital integration operation on the sampling signal from a coordinate position of the digital integration starting point to a coordinate position of the v-th sampling point to be analyzed is executed to form a digital integration result Sy; and a digital integration operation on the sampling signal from a coordinate position of the digital integration starting point to a coordinate position of the v+1-th sampling point to be analyzed is executed to form a digital integration result $S_{v+}1$, and then Step G is entered. The digital integration operation is either the trapezoidal integration or the rectangular integration.

In Step G, whether a product of the digital integration result $S_v$ and the digital integration result $S_{v+}1$ is greater than 0 is determined, in a case of yes, a value for v is updated by adding 1 and Step F is returned to; otherwise, Step H is entered.

In Step H, a coordinate $(T_{ej}, x_{ej})$ of an digital integration ending point located between the v-th sampling point to be analyzed and the v+1-th sampling point to be analyzed is obtained according to a condition that a sum of a digital integration from the digital integration starting point to an digital integration ending point is zero, through the rectangular interpolation means or the trapezoidal interpolation means, and then Step I is entered.

In Step I, the j-th zero-crossing time instant $T_{zj}$ is obtained according to $$T_{zj} = \frac{T_{sj} + T_{ej}}{2},$$

and then Step J is entered.

In Step J, following steps are executed on the zero-crossing time instant $T_{zj}$, according to a preset time constant $T_C$ that is not greater than a period value for the target periodic signal. A signal voltage value $V_j$ at a time instant $T_{zj}+T_C$ is obtained, a signal voltage value series $\{V_{K+1}, \ldots, V_j\}$ is constructed or updated, and then Step K is entered.

Steps: a signal voltage value $V_j$ corresponding to a time instant $T_{zj}+T_C$ position on the target periodic signal after an analog-to-digital conversion is obtained; or a signal voltage value $V_j$ corresponding to a sampled time instant $T_{zj}+T_C$ position on the target periodic signal after the analog-to-digital conversion is obtained; or a signal voltage value $V_j$ corresponding to a time instant position adjacent to and closest to a time instant $T_{zj}+T_C$ position on the target periodic signal after an analog-to-digital conversion is obtained; or a signal voltage value $V_j$ at the time instant $T_{zj}+T_C$ position is obtained by selecting signal voltage values corresponding to an adjacent time instant positions respectively on both sides of a time instant $T_{zj}+T_C$ position on the target periodic signal after the analog-to-digital conversion, through a linear interpolation.

In Step K, whether a length of the signal voltage value series $\{V_{K+1}, \ldots, V_j\}$ is less than a preset threshold n is determined, in a case of yes, Step L is entered; otherwise, latest generated n signal voltage values from the signal voltage value series $\{V_{K+1}, \ldots, V_j\}$ is selected, and through a following formula:

$$V_{noisePower,j} = \sqrt{\frac{\sum_{l=j-(n-1)}^{j}\left(V_l - \overline{V}\right)^2}{n}}$$

A target periodic signal noise $V_{noisePower,j}$ is obtained wherein $\overline{V}$ denotes an average voltage value for the n signal voltage values that are selected to participate in a calculation, and then Step L is entered.

In Step L, a value for j is updated by adding 1, and Step C is returned to.

The periodic measurement technology of this method can be applied to an arbitrary periodic signal, but the sinusoidal signal is taken as an example in the embodiment for descriptions.

Figure 2:
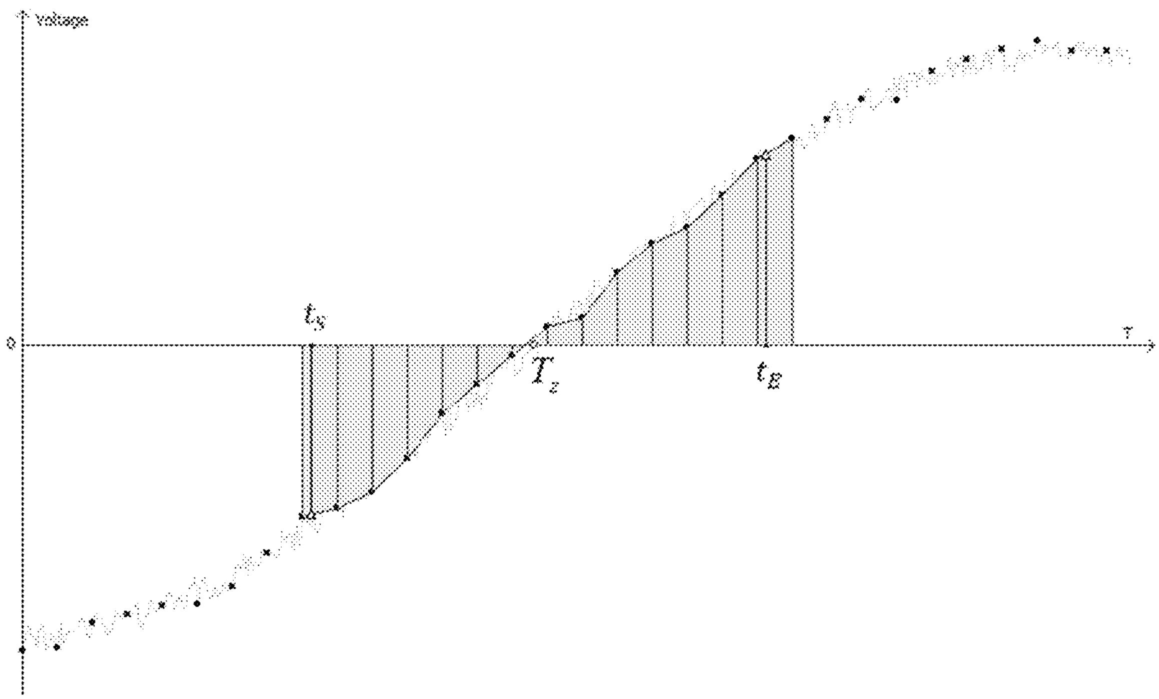
FIG. 2 illustrates a schematic diagram of calculating and obtaining a virtual occurrence time instant of an integration ending point by utilizing a trapezoidal integration and a trapezoidal interpolation, and acquiring a zero crossing point, after calculating and acquiring the integration starting point, in one embodiment of the present disclosure.
Figure 3:
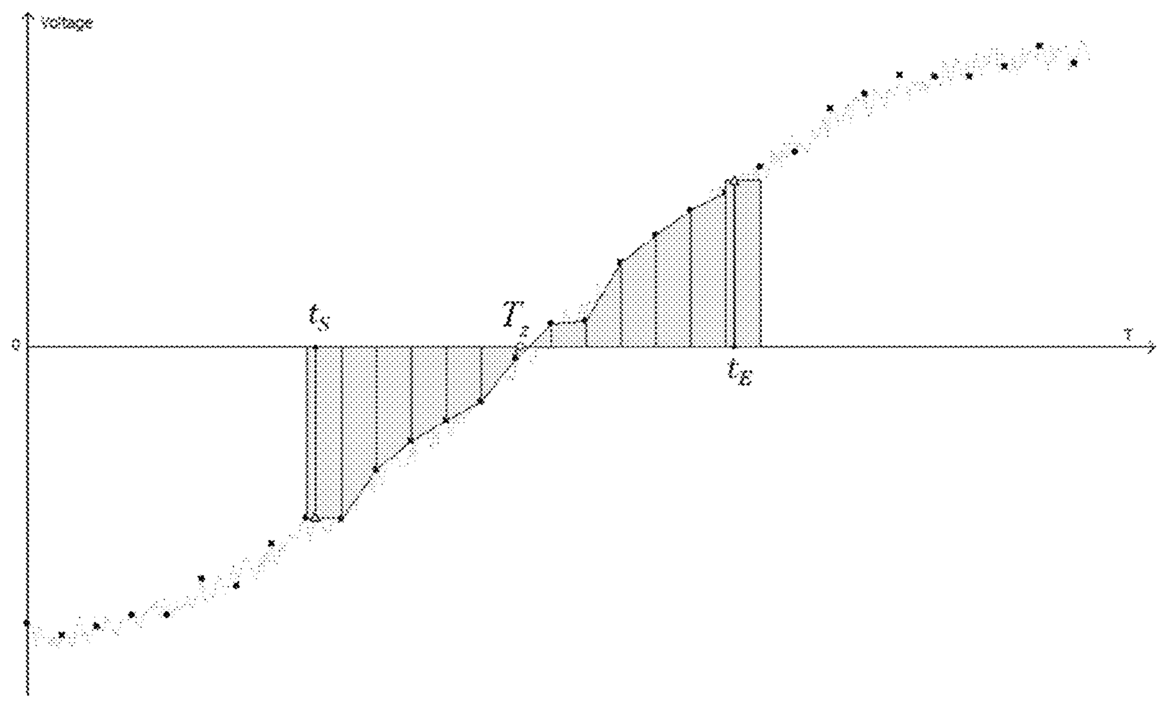
FIG. 3 illustrates a schematic diagram of calculating and obtaining a virtual occurrence time instant of an integration ending point by utilizing a trapezoidal integration and a rectangular interpolation, and acquiring a zero crossing point, after calculating and acquiring the integration starting point, in one embodiment of the present disclosure.

In the actual execution of the above design, the specific operations of calculating the zero-crossing time instant can refer to FIG. 1, FIG. 2, and FIG. 3. The hollow triangle as illustrated in the drawings denotes an integration starting point and an integration ending point. FIG. 1 illustrates a schematic diagram of calculating and obtaining a virtual occurrence time instant of an integration ending point by utilizing the rectangular integration and the rectangular interpolation, and acquiring a zero crossing point. As illustrated in FIG. 1, the digital integration starts at $t_S$, and $t_E$ denotes the virtual occurrence time instant of the integration ending point obtained by the interpolation. The digital integration from $t_S$ to $t_E$ in FIG. 1 is 0, and $T_z$ denotes a calculated and acquired zero-crossing point. FIG. 2 illustrates a schematic diagram of calculating and obtaining a virtual occurrence time instant of an integration ending point by utilizing the trapezoidal integration and the trapezoidal interpolation, and acquiring a zero crossing point. As illustrated in FIG. 2, the digital integration starts at $t_S$, and $t_E$ denotes the virtual occurrence time instant of the integration ending point obtained by the interpolation. The digital integration from $t_S$ to $t_E$ in FIG. 1 is 0, and $T_z$ denotes a calculated and acquired zero-crossing point. FIG. 3 illustrates a schematic diagram of calculating and obtaining a virtual occurrence time instant of an integration ending point by utilizing a trapezoidal integration and a rectangular interpolation, and acquiring a zero crossing point. As illustrated in FIG. 3, the digital integration starts at $t_S$, and $t_E$ denotes the virtual occurrence time instant of the integration ending point obtained by the interpolation. The digital integration from $t_S$ to $t_E$ in FIG. 1 is 0, and $T_z$ denotes a calculated and acquired zero-crossing point. When a trapezoidal interpolation method is purely adopted, there may be a situation where the computational load is too large when performing interpolation calculations. FIG. 3 utilizes a trapezoidal integration means when starting integration; however, in a case where the interpolation operation is performed, a rectangular interpolation method is adopted, so that the purpose of doing this is to reduce the complexity of the operation. In order to obtain a relative accurate measurement result, the height of the rectangle is set to be the average value of the two adjacent sampling points in the calculation of FIG. 3. $T_{sj}$ (that is, $t_S$ in FIG. 3) denotes the calculated integration starting time instant, and the calculation formula of whom is $T_{sj}=T_{z(j-1)}+(T_{z(j-1)}-T_{z(j-2)})\times 0.89$, that is, c=0.89, $T=(T_{z(j-1)}-T_{z(j-2)})$, and $T=(T_{z(j-1)}-T_{z(j-3)})/2$ is recommended to be utilized. The following means can also be used: when calculating the integration starting time instant, the number of zero-crossing points obtained previously is determined. In a case where merely two zero-crossing points are obtained previously, $T=(T_{z(j-1)}-T_{z(j-2)})$ is utilized; in a case where the zero-crossing points obtained previously are greater than two, $T=(T_{z(j-1)}-T_{z(j-3)})/2$ can also be utilized. The schematic diagram of integrating and calculating the zero-crossing point at a certain zero-crossing point after the electrical signal passes through the positive peak value is omitted.

Figure 4:
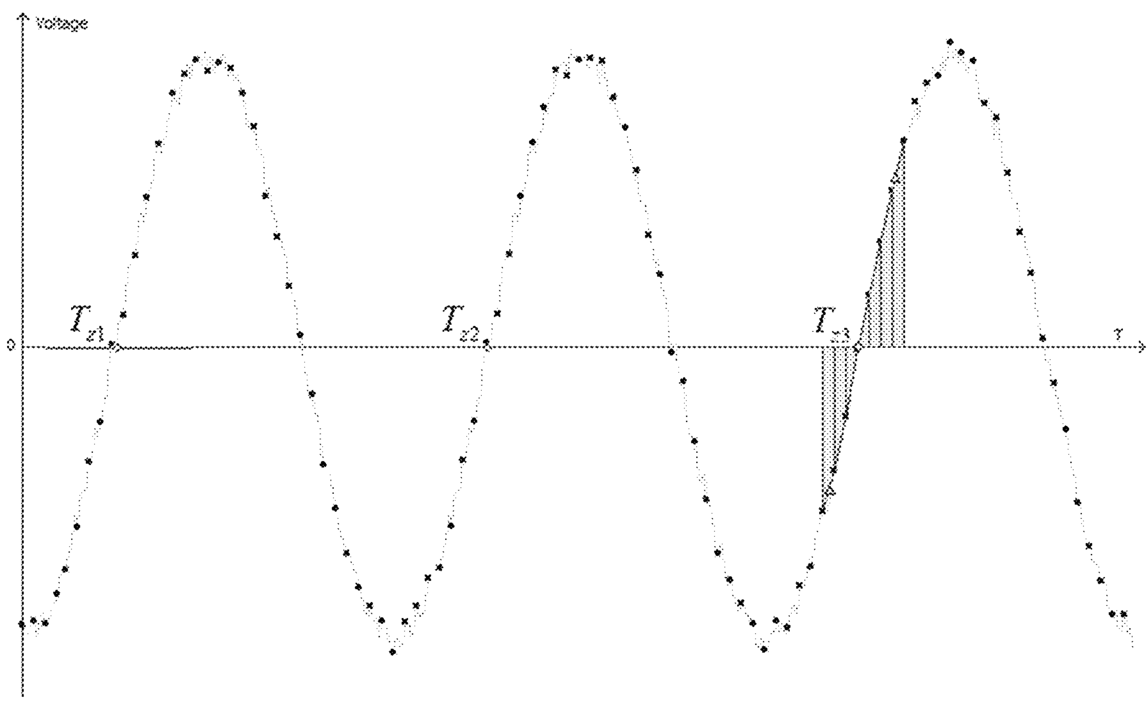
FIG. 4 illustrates a schematic diagram of acquiring the third zero-crossing point by utilizing the traditional zero-crossing point comparison means to obtain the zero-crossing points after the two negative peak values, and calculating the virtual occurrence time instant of the integration ending point through a trapezoidal integration and a trapezoidal interpolation after calculating and acquiring the integration starting point, in one embodiment of the present disclosure.
Figure 5:
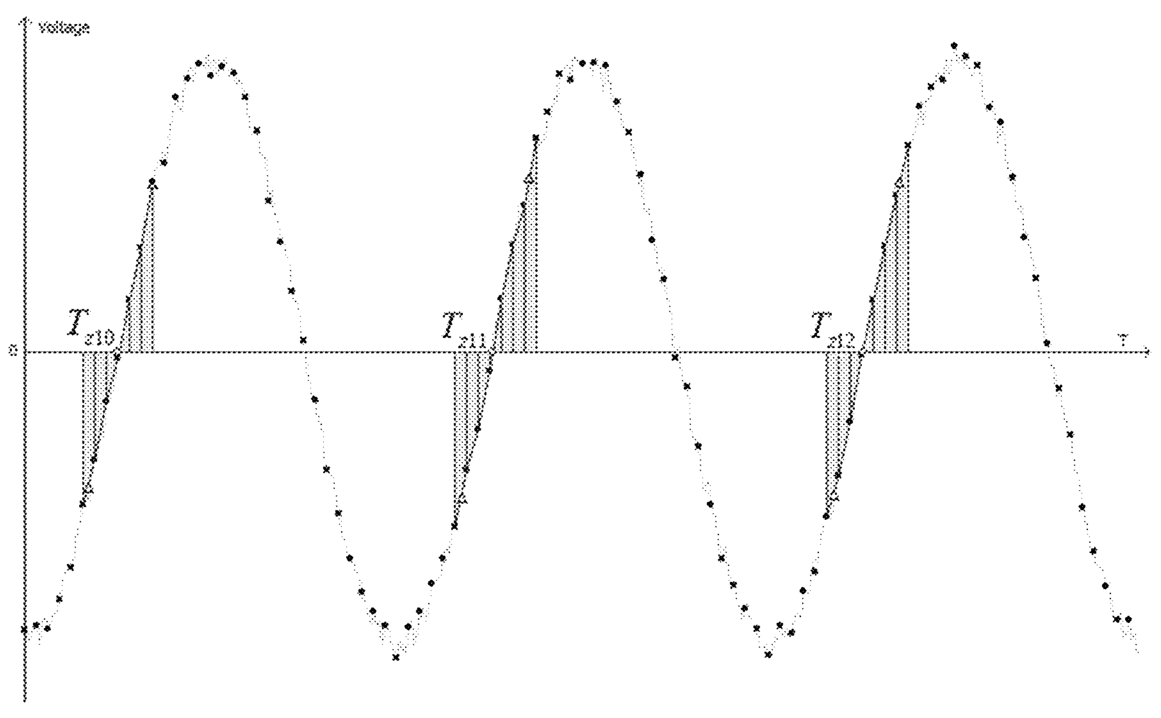
FIG. 5 illustrates a schematic diagram of acquiring the 10-th, the 11-th and the 12-th zero-crossing points by utilizing the traditional zero-crossing point comparison means to obtain two zero-crossing points after two negative peak values, and calculating and acquiring the virtual occurrence time instant of the integration ending point through a trapezoidal integration and a trapezoidal interpolation after calculating and acquiring the integration starting point, in one embodiment of the present disclosure.

Further, FIG. 4 and FIG. 5 illustrates the graphs of frequency calculation and measurement near each of the zero points after sampling the electrical signals. FIG. 4 illustrates a schematic diagram of acquiring the third zero-crossing point by utilizing the traditional zero-crossing point comparison means to obtain the zero-crossing points after the two negative peak values, and calculating the virtual occurrence time instant of the integration ending point through the trapezoidal integration and the trapezoidal interpolation after calculating and acquiring the integration starting point. FIG. 5 illustrates a schematic diagram of acquiring the 10-th, the 11-th and the 12-th zero-crossing points by utilizing the traditional zero-crossing point comparison means to obtain two zero-crossing points after two negative peak values, and calculating the virtual occurrence time instant of the integration ending point through a trapezoidal integration and a trapezoidal interpolation after calculating and acquiring the integration starting point. FIG. 4 illustrates that two zero-crossing points $T_{Z1}$ and $T_{Z2}$ are calculated by using the traditional zero-crossing point comparison means and $T_{S3}$ is calculated and obtained by $T_{Z1}$ and $T_{Z2}$, then one digital integration is started at $T_{S3}$, the integration is terminated at $T_{E3}$, and eventually $T_{Z3}$ is calculated and obtained by $T_{S3}$ and $T_{E3}$. FIG. 5 illustrates a schematic diagram of calculating and acquiring the 10-th, 11-th and 12-th zero-crossing points. The integration starting points and the integration ending points calculated and obtained in FIG. 5 are expressed by the hollow triangles, $T_{Z10}$, $T_{Z11}$ and $T_{Z12}$ are the calculated and obtained 10-th, 11-th and 12-th zero-crossing points. The period of the signal can be expressed as $T_{p10}=T_{Z11}-T_{Z10}$ Or $T_{p11}=T_{Z12}-T_{Z11}$, and the frequency is the inverse of the period. The diagram of calculating and acquiring a zero-crossing point and calculating a graph of the frequency through a rectangular integration, and a rectangular interpolation means or a trapezoidal integration, and a rectangular interpolation means is omitted. And a graph of obtaining the zero-crossing points after two positive peaks and then measuring the frequency is omitted.

It can be seen from the accompanying drawings that the zero points obtained by the trapezoidal integration and the trapezoidal interpolation means is closest to the zero points of the actual signal, the zero points obtained by using the trapezoidal integration and the rectangular interpolation means have a certain error with the zero points of the actual signal, and the zero points obtained by the rectangular integration and the rectangular interpolation means have a largest error with the zero points of the actual signal. However, as the number of sampling points increases, this errors become smaller and smaller. By considering the characteristics of the embedded system, the preferred solution is to calculate the zero-crossing points of the signal by utilizing the trapezoidal integration and the rectangular interpolation means.

According to another aspect of the present disclosure, the following Step i to Step vii are designed to be executed on the target periodic signal, to obtain a noise of the target periodic analog signal.

In Step i, a continuous zero-crossing time series $T_{z1}, \ldots, T_{zk}> \ldots, T_{zK}$ of at least two periods on the sampled signal after passing a negative peak value or a positive peak value is obtained through an analog means or a digital means, wherein K denotes the number of zero-crossing time instants in the continuous zero-crossing time series, and $T_{zk}$ denotes the k-th zero-crossing time instant in the continuous zero-crossing time series; and then j=K+1 is initialized and Step ii is entered.

In Step ii, an average period T is calculated and obtained according to $T_{z(j-1)}, \ldots, T_{z(j-m)}$, and further a digital initial integration point time instant $T_{sj}$ corresponding to the j-th zero-crossing time instant $T_{zj}$ is calculated and obtained according to a preset parameter c that satisfies a value range (0.5, 1), through $T_{sj}=T_{z(j-1)}+T\times c$, and $T_{sj}$ is calibrated and updated according to circuit delay parameters, and then Step iii is entered, wherein 1<m<j, and $T_{zj}$ denotes the j-th zero-crossing time instant. According to $T_{z(j-1)}, \ldots, T_{z(j-m)}$, the average period T is calculated and obtained through $$T = \frac{T_{z(j-1)} - T_{z(j-m)}}{m-1}.$$

With regard to the value for the preset parameter c, c is not suitable to be too close to 1, and in a case wherein c is close to 1, the calculation time is too short, which affects the measurement accuracy of the measurement period and further affects the accuracy of noise measurement.

In Step iii, an integrator is initialized before the time instant $T_{sj}$ to return an integrator output voltage to zero, and an analog integration is started at a digital integration starting point time instant $T_{sj}$, in a case where the integrator output voltage returns to zero again, the integration is terminated and an integration ending point time instant $T_{ej}$ is recorded, and according to the circuit delay parameters, $T_{ej}$ is calibrated and updated, and then Step iv is entered. Analog integration is implemented by utilizing operational amplifiers or other devices with integration functions.

In Step iv, the j-th zero-crossing time instant $T_{zj}$ is obtained according to $$T_{zj} = \frac{T_{sj} + T_{ej}}{2},$$

and then Step v is entered.

In Step v, following steps are executed on the zero-crossing time instant $T_{zj}$ according to a preset time constant $T_C$ that is not greater than a period value for the target periodic signal, a signal voltage value $V_j$ at a time instant $T_{zj}+T_C$ is obtained, a signal voltage value series $\{V_{K+1}, \ldots, V_j\}$ is constructed or updated and then Step vi is entered.

Steps: a signal voltage value $V_j$ corresponding to a time instant $T_{zj}+T_C$ position on the target periodic signal for an analog-to-digital conversion is obtained; or a signal voltage value $V_j$ corresponding to a sampled time instant $T_{zj}+T_C$ position on the target periodic signal after the analog-to-digital conversion is obtained; or a signal voltage value $V_j$ corresponding to a time instant position adjacent to and closest to a time instant $T_{zj}+T_C$ position on the target periodic signal after an analog-to-digital conversion is obtained; or a signal voltage value $V_j$ at the time instant $T_{zj}+T_C$ position is obtained by selecting signal voltage values corresponding to an adjacent time instant positions respectively on both sides of a time instant $T_{zj}+T_C$ position on the target periodic signal after the analog-to-digital conversion, through the linear interpolation.

In Step vi, whether a length of the signal voltage value series $\{V_{K+1}, \ldots, V_j\}$ is less than a preset threshold n is determined, in a case of yes, Step vii is entered; otherwise, latest generated n signal voltage values are selected from the signal voltage value series $\{V_{K+1}, \ldots, V_j\}$, and through a following formula:

$$V_{noisePower,j} = \sqrt{\frac{\sum_{l=j-(n-1)}^{j} (V_l - \overline{V})^2}{n}},$$

A target periodic signal noise $V_{noisePower,j}$ is obtained wherein $\overline{V}$ denotes an average voltage value for the n signal voltage values that are selected to participate in a calculation, and then Step vii is entered.

In Step vii, a value for j is updated by adding 1, and Step ii is returned to.

Figure 6:
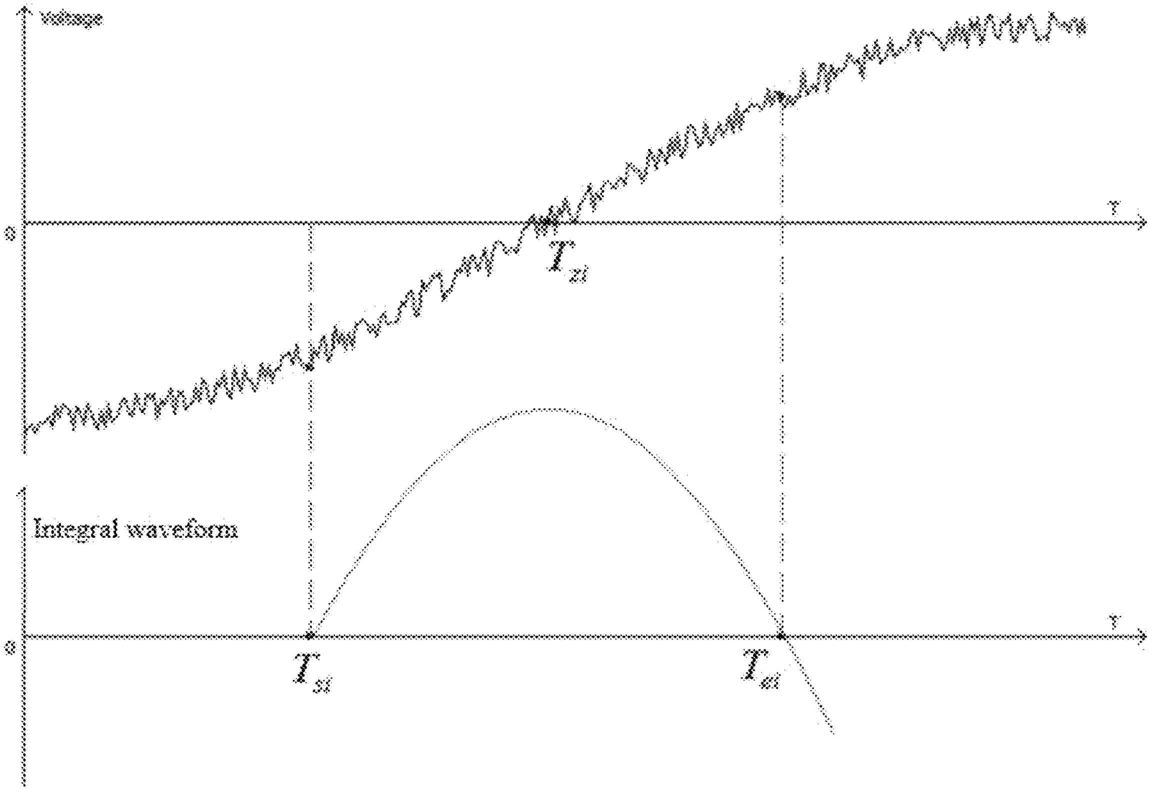
FIG. 6 illustrates a schematic diagram of integrating and calculating the zero-crossing point at a certain zero point of an electrical signal in one embodiment of the present disclosure.

In the actual execution of the above design, the specific operations can refer to FIG. 6. and FIG. 6 is divided into an upper portion and a lower portion, the upper portion is a measured electrical signal (the horizontal ordinate T denotes time instant, the longitudinal coordinate voltage denotes a measured electrical signal voltage), and the lower portion is an integration waveform of the measured signal. $T_{si}$ in the drawing denotes the integration starting time instant, $T_{ei}$ denotes the integration ending time instant, and $T_{zi}$ denotes the zero-crossing point obtained by calculation. $T_{si}$ denotes the calculated and obtained integration starting time instant, and the calculation formula is $T_{si}=T_{z(i-1)}+(T_{z(i-1)}-T_{z(i-2)})\times 0.89$, that is, c=0.89, $T=(T_{z(i-1)}-T_{z(i-2)})$, and $T=(T_{z(i-1)}-T_{z(i-3)})/2$ is recommended to be utilized. Also, following means can be utilized, when calculating the integration starting time instant, the number of zero-crossing points obtained previously is determined. In a case where merely two zero-crossing points are obtained previously, $T=(T_{z(i-1)}-T_{z(i-2)})$ is utilized; in a case where the zero-crossing points obtained previously are greater than two, $T=(T_{z(i-1)}-T_{z(i-3)})/2$ can also be utilized. The schematic diagram of integrating and calculating the zero-crossing point at a certain zero-crossing point after the electrical signal passes through the positive peak value is omitted.

Figure 7:
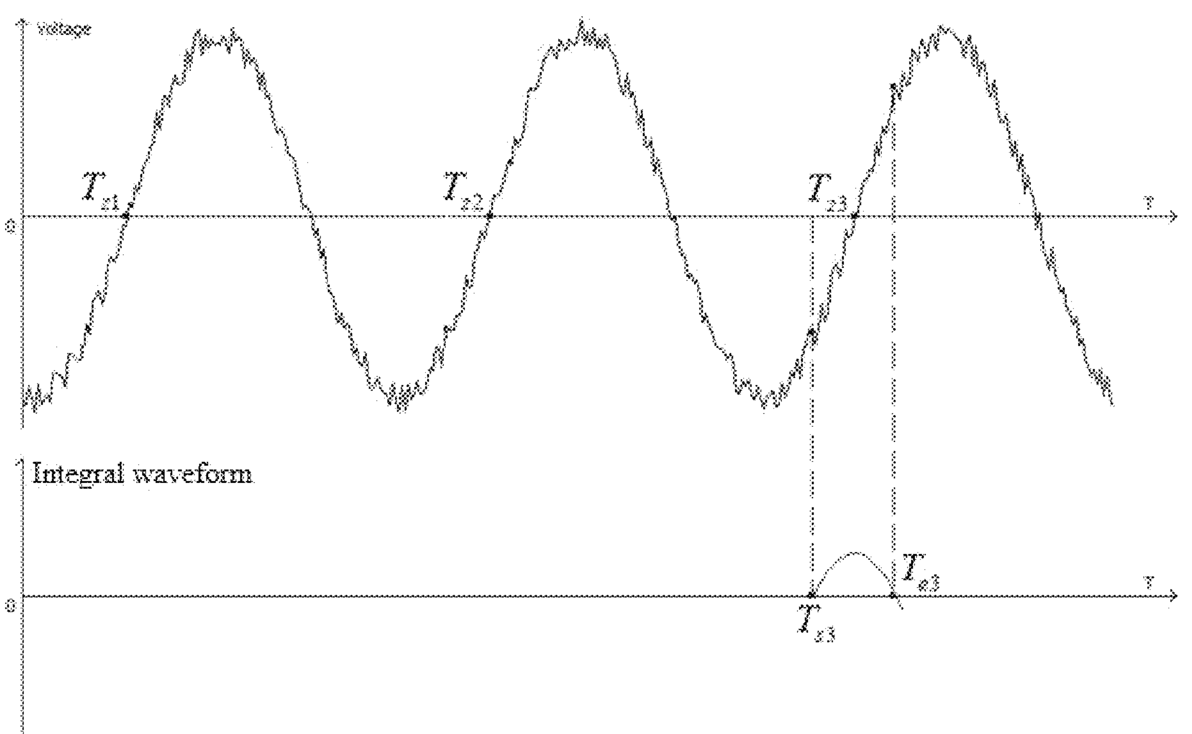
FIG. 7 illustrates a schematic diagram of obtaining the third zero-crossing point by utilizing the method described in the present disclosure after obtaining two zero-crossing points through the traditional zero-crossing comparison means in one embodiment of the present disclosure.
Figure 8:
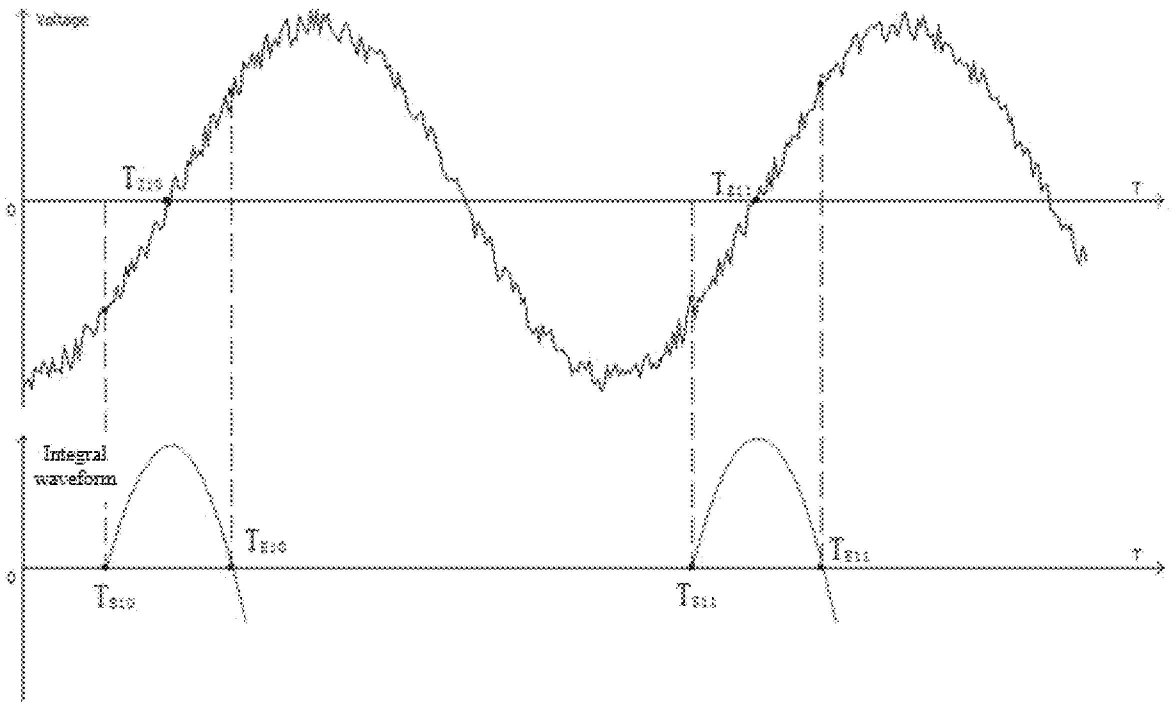
FIG. 8 illustrates a schematic diagram of an analog integration, after a measured electrical signal passes a negative peak value, that is, the integration is performed once per period and a signal period is calculated, in one embodiment of the present disclosure.
Figure 9:
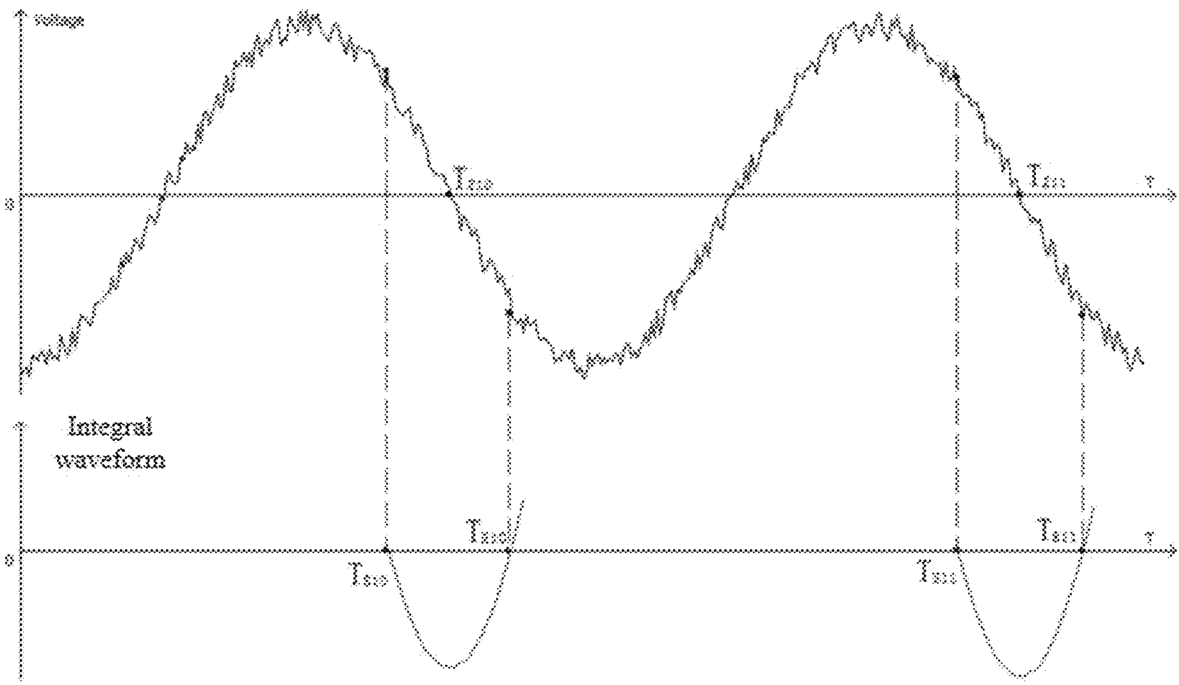
FIG. 9 illustrates a schematic diagram of an analog integration, after the measured electrical signal passes a positive peak value, that is, the integration is performed once per period and the signal period is calculated, in one embodiment of the present disclosure.

Further specific operations may refer to FIG. 7, FIG. 8 and FIG. 9. FIG. 7, FIG. 8, and FIG. 9 are all divided into upper and lower two portions, the upper portion is a measured electrical signal, and the lower portion is an integration waveform of a measured signal. FIG. 7 illustrates two zero-crossing points $T_{Z1}$, $T_{Z2}$ obtained by using the traditional zero-crossing point comparison means, $T_{S3}$ is obtained by calculating $T_{Z1}$ and $T_{Z2}$, then the integration starts at $T_{S3}$, the integration is terminated at $T_{E3}$, and eventually $T_{Z3}$ is obtained by calculating $T_{S3}$ and $T_{E3}$. A schematic diagram of integrating and obtaining the third zero-crossing point after the electric signal crosses the positive peak value is omitted. FIG. 8 illustrates a schematic diagram of an analog integration, after a measured electrical signal passes a negative peak value, that is, the integration is performed once per period and a signal period is calculated. $T_{S10}$ and $T_{S11}$ in FIG. 8 are calculated and obtained integration starting time instants, $T_{E10}$ and $T_{E11}$ are corresponding integration ending time instants, and $T_{Z10}$ and $T_{Z11}$ are calculated and obtained 10-th and 11-th zero-crossing points. FIG. 9 illustrates a schematic diagram of an analog integration, after a measured electrical signal passes a positive peak value, that is, the integration is performed once per period and the signal period is calculated. $T_{S10}$ and $T_{S11}$ in FIG. 9 are calculated and obtained integration starting time instants, $T_{E10}$ and $T_{E11}$ are corresponding integration ending time instants, and $T_{Z10}$ and $T_{Z11}$ are calculated and obtained 10-th and 11-th zero-crossing points.

According to another solution of the present disclosure, a method for measuring a signal-to-noise ratio of a sinusoidal signal is designed by the present disclosure, and a corresponding method for measuring signal-to-noise ratio is designed for a target sinusoidal digital signal and a target sinusoidal analog signal, respectively, and the following Step A' to Step N' are performed on the target sinusoidal digital signal.

In Step A', according to an equal time interval sampling means or an unequal time interval sampling means, the target periodic signal is sampled to obtain a sampled signal, and then step B' is entered.

In Step B', a continuous zero-crossing time series $T_{z1}, \ldots, T_{zk}, \ldots, T_{zK}$ of at least two periods on the sampled signal after passing a negative peak value or a positive peak values is obtained through an analog means or a digital means, wherein K denotes the number of zero-crossing time instants in the continuous zero-crossing time series, and $T_{zk}$ denotes the k-th zero-crossing time instant in the continuous zero-crossing time series; and then j=K+1 is initialized and Step C' is entered.

In Step C', an average period T is calculated and obtained according to $T_{z(j-1)}, \ldots, T_{z(j-m)}$, and further a digital initial integration point time instant $T_{sj}$ corresponding to the j-th zero-crossing time instant $T_{zj}$ is calculated and obtained according to a preset parameter c that satisfies a value range (0.5, 1), through $T_{sj}=T_{z(j-1)}+T\times c$, and then Step D' is entered, wherein, 1<m<j, and $T_{zj}$ denotes the j-th zero-crossing time instant.

In the actual application of Step C', according to $T_{z(j-1)}, \ldots, T_{z(j-m)}$, the average period T is calculated and obtained through $$T = \frac{T_{z(j-1)} - T_{z(j-m)}}{m-1}.$$

With regard to the value for the preset parameter c, c is not suitable to be too close to 1, and in a case wherein c is close to 1, the calculation time is shortened, which affects the accuracy of noise measurement.

In Step D', two sampling points that are adjacent front and back to the digital initial integration point time instant $T_{sj}$ are selected on the basis of each sampling point on the sampling signal, and the first sampling point to be analyzed, and the second sampling point to be analyzed are sequentially formed, a coordinate of the sampling point to be analyzed is formed by combining a time instant corresponding to the sampling point and a sampling value corresponding to the sampling point, and then Step E' is entered.

In Step E', a sampling value $x_{sj}$ corresponding to $T_{sj}$ and at a position between the first sampling point and the second sampling point are obtained according to the digital initial integration point time instant $T_{sj}$, through a rectangular interpolation means or a trapezoidal interpolation means, to form a coordinate $(T_{sj}, x_{sj})$ of a digital integration starting point, and then v=2 is initialized, each sampling point after the first sampling point and the second sampling point on the sampling signal is sequentially defined as each sampling point to be analyzed, and Step F' is entered.

In Step F', a digital integration operation on the sampling signal from a coordinate position of the digital integration starting point to a coordinate position of the v-th sampling point to be analyzed is executed to form a digital integration result Sy; and a digital integration operation on the sampling signal from a coordinate position of the digital integration starting point to a coordinate position of the v+1-th sampling point to be analyzed is executed to form a digital integration result $S_{v+}1$, and then Step G' is entered. The digital integration operation here is either the trapezoidal integration or the rectangular integration.

In Step G', whether a product of the digital integration result $S_v$ and the digital integration result $S_{v+}1$ is greater than 0 is determined, in a case of yes, a value for v is updated by adding 1 and Step F' is returned to; otherwise, Step H' is entered.

In Step H', a coordinate $(T_{ej}, x_{ej})$ of an digital integration ending point located between the v-th sampling point to be analyzed and the v+1-th sampling point to be analyzed is obtained according to a condition that a sum of a digital integration from the digital integration starting point to an digital integration ending point is zero, through the rectangular interpolation means or the trapezoidal interpolation means, and then Step I' is entered.

In Step I', the j-th zero-crossing time instant $T_{zj}$ is obtained according to $$T_{zj} = \frac{T_{sj} + T_{ej}}{2},$$

further, an integration time duration $T_{ej}$ corresponding to the j-th zero-crossing time instant $T_{zj}$ is obtained according to $T_{tj}=T_{ej}-T_{sj}$, and an integration time duration $T_{ej}$ corresponding to the j-th zero-crossing time instant $T_{zj}$ is formed, and then Step J' is entered.

In Step J', a measured signal period is obtained according to the target zero-crossing time instant $T_{zj}$, through $T_{p(j-1)}=T_{zj}-T_{z(j-1)}$, a tested signal frequency is obtained through $$F_{(j-1)} = \frac{1}{T_{p(j-1)}} = \frac{1}{T_{zj} - T_{z(j-1)}},$$

and then Step K' is entered.

In Step K', whether a length of a signal zero-crossing time series $\{T_{z(K+1)}, \ldots, T_{zj}\}$ is less than a preset threshold w+1 is determined, in case of yes, Step N' is entered; otherwise, a following calculation is performed: w latest generated integration time durations are selected from the signal integration time duration series $\{T_{t(K+1)}, \ldots, T_{tj}\}$, an average integration time duration $T_{ta}$ is calculated and acquired, and the average integration time duration $T_{ta}$ is converted into a count value n corresponding to a sampling period multiple; w latest generated signal periods are selected from a signal period series $\{T_{p(K+1)}, \ldots, T_{p(j-1)}\}$, an average period value $T_{pa}$ is calculated and acquired, the average period value $T_{pa}$ is converted into a count value N corresponding to the sampling period multiple, and then Step L' is entered.

In Step L', a period standard deviation $\sigma_T$ is calculated and obtained according to the w latest generated signal periods selected from the signal period series $\{T_{p(K+1)}, \ldots, T_{p(j-1)}\}$, and a parameter $\sigma_R$ is obtained through $$\sigma_R = \frac{\sigma_T}{T_{pa}};$$

or, a frequency standard deviation $\sigma_F$ is calculated and obtained according to w latest generated signal frequencies selected from a signal frequency series $\{F_{(K+1)}, \ldots, F_{(j-1)}\}$, a parameter $\sigma_R$ is obtained through $$\sigma_R = \frac{\sigma_F}{1/T_{pa}},$$

and then step M' is entered.

In Step M', since that N corresponds to the signal period (N varies since N is subjected to the noise interference), the size of n is controlled by c (n is subjected to the noise interference, and the influence of factors such as the rounding during the operation), thus the formula n/N is approximately equal to 2*(1−c), and a variant of the formula exists. Thus, according to count values n and N, as well as the parameter $\sigma_R$, in combination of $$SNR = \frac{A^2}{2\sigma^2},$$

according to following an arbitrary of following four formulas:

$$SNR = \frac{A^2}{2\sigma^2} = \frac{n}{\left\{2 \times \sigma_R \times N \times \sin\left[\frac{n}{N} \times \pi\right]\right\}^2}$$

$$SNR = \frac{A^2}{2\sigma^2} = \frac{N \times 2 \times (1-c)}{\left\{2 \times \sigma_R \times N \times \sin\left[\frac{n}{N} \times \pi\right]\right\}^2}$$

$$SNR = \frac{A^2}{2\sigma^2} = \frac{n}{\{2 \times \sigma_R \times N \times \sin[2 \times (1-c) \times \pi]\}^2}$$

$$SNR = \frac{A^2}{2\sigma^2} \frac{N \times 2 \times (1-c)}{\{2 \times \sigma_R \times N \times \sin[2 \times (1-c) \times \pi]\}^2}$$

A signal-to-noise ratio SNR of the target sinusoidal signal is calculated and obtained, wherein A denotes the peak value for the sinusoidal signal, σ denotes the Noise RMS for the signal, and then Step N' is entered. In practical applications, it is not limited to the above four formulas, and possibilities for expressing by other formulas also exist.

In Step N', a value for j is updated by adding 1, and Step C' is returned to.

In an actual application, specific operations for calculating the zero-crossing point time instant refer to FIG. 1 FIG. 2, FIG. 3. The hollow triangles in FIG. 3 denote the integration starting point and the integration ending point. FIG. 1 illustrates a schematic diagram of calculating and obtaining a virtual occurrence time instant of an integration ending point by utilizing the rectangular integration and the rectangular interpolation, and acquiring a zero-crossing point. As illustrated in FIG. 1, the digital integration starts at $t_S$, $t_E$ denotes the virtual occurrence time instant of the integration ending point obtained by interpolation, and the digital integration from $t_S$ to TE $t_E$ in FIG. 1 is 0, and $T_z$ denotes a calculated and acquired zero-crossing point. FIG. 2 illustrates a schematic diagram of calculating and obtaining a virtual occurrence time instant of an integration ending point by utilizing the trapezoidal integration and the trapezoidal interpolation, and acquiring a zero-crossing point. As illustrated in FIG. 2, the digital integration starts at $t_S$, $t_E$ denotes the virtual occurrence time instant of the integration ending point obtained by the interpolation, and the digital integration from $t_S$ to TE $t_E$ in FIG. 1 is 0, and $T_z$ denotes a calculated and acquired zero-crossing point. FIG. 3 illustrates a schematic diagram of calculating and obtaining a virtual occurrence time instant of an integration ending point by utilizing the trapezoidal integration and the rectangular interpolation, and acquiring a zero crossing point. As illustrated in FIG. 3, the digital integration starts at $t_S$, $t_E$ denotes the virtual occurrence time instant of the integration ending point obtained by interpolation. The digital integration from $t_S$ to $t_E$ in FIG. 1 is 0, and $T_z$ denotes a calculated and acquired zero-crossing point. When a trapezoidal interpolation method is purely adopted, there may be a situation where the computational load is too large when performing interpolation calculations. FIG. 3 utilizes a trapezoidal integration means when starting integration; however, in a case where the interpolation operation is performed, a rectangular interpolation method is adopted, so that the purpose of doing this is to reduce the complexity of the operation. In order to obtain a relative accurate measurement result, the height of the rectangle is set to be the average value of the two adjacent sampling points in the calculation of FIG. 3. $T_{Sj}$ (that is, $t_S$ in FIG. 3) denotes the calculated integration starting time instant, and the calculation formula of whom is $T_{sj}=T_{z(j-1)}+(T_{z(j-1)}-T_{z(j-2)})\times 0.89$, that is, c=0.89, $T=(T_{z(j-1)}-T_{z(j-2)})$, and $T=(T_{z(j-1)}-T_{z(j-3)})/2$ is recommended to be utilized. The following means can also be used: when calculating the integration starting time instant, the number of zero-crossing points obtained previously is determined. In a case where merely two zero-crossing points are obtained previously, $T=(T_{z(j-1)}-T_{z(j-2)})$ is utilized; in a case where the zero-crossing points obtained previously are greater than two, $T=(T_{z(j-1)}-T_{z(j-3)})/2$ can also be utilized. The schematic diagram of integrating and calculating the zero-crossing point at a certain zero-crossing point after the electrical signal passes through the positive peak value is omitted.

FIG. 4 and FIG. 5 illustrates the graphs of frequency calculation and measurement near each of the zero points after sampling the electrical signals. FIG. 4 illustrates a schematic diagram of acquiring the third zero-crossing point by utilizing the traditional zero-crossing point comparison means to obtain the zero-crossing points after the two negative peak values, and calculating the virtual occurrence time instant of the integration ending point through the trapezoidal integration and the trapezoidal interpolation after calculating and acquiring the integration starting point. FIG. 5 illustrates a schematic diagram of acquiring the 10-th, the 11-th and the 12-th zero-crossing points by utilizing the traditional zero-crossing point comparison means to obtain two zero-crossing points after two negative peak values, and calculating the virtual occurrence time instant of the integration ending point through a trapezoidal integration and a trapezoidal interpolation after calculating and acquiring the integration starting point. FIG. 4 illustrates that two zero-crossing points $T_{Z1}$ and $T_{Z2}$ are calculated by using the traditional zero-crossing point comparison means and $T_{S3}$ is calculated and obtained by $T_{Z1}$ and $T_{Z2}$, then one digital integration is started at $T_{S3}$, the integration is terminated at $T_{E3}$, and eventually $T_{Z3}$ is calculated and obtained by $T_{S3}$ and $T_{E3}$. FIG. 5 illustrates a schematic diagram of calculating and acquiring the 10-th, 11-th and 12-th zero-crossing points. The integration starting points and the integration ending points calculated and obtained in FIG. 5 are expressed by the hollow triangles, $T_{Z10}$, $T_{Z11}$ and $T_{Z12}$ are the calculated and obtained 10-th, 11-th and 12-th zero-crossing points. The period of the signal can be expressed as $T_{p10}=T_{Z11}-T_{Z10}$ or $T_{p11}=T_{Z12}-T_{Z11}$, and the frequency is the inverse of the period. The diagram of calculating and acquiring a zero-crossing point and calculating a graph of the frequency through a rectangular integration, and a rectangular interpolation means or a trapezoidal integration, and a rectangular interpolation means is omitted. And a graph of obtaining the zero-crossing points after two positive peaks and then measuring the frequency is omitted.

It can be seen from the accompanying drawings that the zero points obtained by the trapezoidal integration and the trapezoidal interpolation means is closest to the zero points of the actual signal, the zero points obtained by using the trapezoidal integration and the rectangular interpolation means have a certain error with the zero points of the actual signal, and the zero points obtained by the rectangular integration and the rectangular interpolation means have a largest error with the zero points of the actual signal. However, as the number of sampling points increases, this error become smaller and smaller. By considering the characteristics of the embedded system, the preferred solution is to calculate the zero-crossing points of the signal by utilizing the trapezoidal integration and the rectangular interpolation means.

According to another aspect of the present disclosure, in one embodiment, the following Step i' to Step ix' are designed to be executed on the target periodic signal.

In Step i', a continuous zero-crossing time series $T_z1, \ldots, T_{zk}, \ldots, T_{zK}$ of at least two periods on the sampled signal after passing a negative peak value or a positive peak values is obtained through an analog means or a digital means, wherein K denotes the number of zero-crossing time instants in the continuous zero-crossing time series, and $T_{zk}$ denotes the k-th zero-crossing time instant in the continuous zero-crossing time series; and then j=K+1 is initialized and Step ii' is entered.

In Step ii', an average period T is calculated and obtained according to $T_{z(j-1)}, \ldots, T_{z(j-m)}$, and a digital initial integration point time instant $T_{sj}$ corresponding to the j-th zero-crossing time instant is further calculated and obtained according to a preset parameter c that satisfies a value range (0.5, 1), through $T_{sj}=T_{z(j-1)}+T\times c$, and then Step iii' is entered, wherein 1<m<j, and $T_{zj}$ denotes the j-th zero-crossing time instant.

In an application, according to $T_{z(j-1)}, \ldots, T_{z(j-m)}$, the average period T is calculated and obtained through $$T = \frac{T_{z(j-1)} - T_{z(j-m)}}{m-1}.$$

And in Step ii', after obtaining the digital integration starting point time instant $T_{sj}$ corresponding to the j-th zero-crossing time instant $T_{zj}$, $T_{sj}$ is calibrated and updated according to the circuit delay parameters. With regard to the value for the preset parameter c, c is not suitable to be too close to 1, and in a case where c is close to 1, the calculation time is too short, which affects the measurement accuracy of the measurement period and further affects the accuracy of signal-to-noise ratio measurement.

In Step iii', an integrator is initialized before the time instant $T_{sj}$, to return an integrator output voltage to zero, and an analog integration is started at a digital integration starting point time instant $T_{sj}$, in a case where the integrator output voltage returns to zero again, the integration is terminated, and an integration ending point time instant $T_{ej}$ is recorded, and then Step iv' is entered. And in Step iii, after obtaining $T_{ej}$, $T_{ej}$ is calibrated and updated according to the circuit delay parameters. And the analog integration herein is implemented by utilizing operational amplifiers or other devices with integration functions.

In Step iv', the j-th zero-crossing point time instant $T_{zj}$ is obtained through $$T_{zj} = \frac{T_{sj} + T_{ej}}{2},$$

and further an integration time duration $T_{tj}$ corresponding to the j-th zero-crossing time instant $T_{zj}$ is obtained through $T_{tj}=T_{ej}-T_{sj}$, to form an integration time duration $T_{tj}$ corresponding to a j-th target zero-crossing time instant $T_{zj}$, and then Step v' is entered.

In Step v', a measured signal period is obtained according to the target zero-crossing time instant $T_{zj}$, through $T_{p(j-1)}=T_{zj}-T_{z(j-1)}$, a tested signal frequency is obtained through $$F_{(j-1)} = \frac{1}{T_{p(j-1)}} = \frac{1}{T_{zj} - T_{z(j-1)}},$$

and then Step vi' is entered.

In Step vi', whether a length of a signal zero-crossing time series $\{T_{z(K+1)}, \ldots, T_{zj}\}$ is less than a preset threshold w+1 is determined, in case of yes, Step ix' is entered; otherwise, the following calculation is performed. w latest generated integration time durations are selected from the signal integration time duration series $\{T_{t(K+1)}, \ldots, T_{tj}\}$, an average integration time duration $T_{ta}$ is calculated and acquired, and the average integration time duration $T_{ta}$ is converted into a count value n corresponding to a counter period multiple; w latest generated signal periods are selected from a signal period series $\{T_{p(K+1)}, \ldots, T_{p(j-1)}\}$, an average period value $T_{pa}$ is calculated and acquired, the average period value $T_{pa}$ is converted into a count value N corresponding to the counter period multiple, and then Step vii' is entered.

In Step vii', a period standard deviation $\sigma_T$ is calculated and obtained according to the w latest generated signal periods selected from a signal period series $\{T_{p(K+1)}, \ldots, T_{p(j-1)}\}$, and a parameter $\sigma_R$ is obtained through $$\sigma_R = \frac{\sigma_T}{T_{pa}};$$

or, a frequency standard deviation $\sigma_F$ is calculated and obtained according to w latest generated signal frequencies selected from a signal frequency series $\{F_{(K+1)}, \ldots, F_{(j-1)}\}$, a parameter $\sigma_R$ is obtained through $$\sigma_R = \frac{\sigma_F}{1/T_{pa}},$$

and then Step viii' is entered.

In Step viii', since that N corresponds to the signal period (N varies since N is subjected to the noise interference), the size of n is controlled by c (n is subjected to the noise interference, and the influence of factors such as the rounding during the operation), thus the formula n/N is approximately equal to 2*(1−c), and a variant of the formula exists. Thus, according to count values n and N, as well as the parameter $\sigma_R$, in combination of $$SNR = \frac{A^2}{2\sigma^2},$$

according to following an arbitrary of following four formulas:

$$SNR = \frac{A^2}{2\sigma^2} = \frac{n}{\left\{2\times\sigma_R\times N\times\sin\left[\frac{n}{N}\times\pi\right]\right\}^2}$$

$$SNR = \frac{A^2}{2\sigma^2} = \frac{N\times 2\times(1-c)}{\left\{2\times\sigma_R\times N\times\sin\left[\frac{n}{N}\times\pi\right]\right\}^2}$$

$$SNR = \frac{A^2}{2\sigma^2} = \frac{n}{\{2\times\sigma_R\times N\times\sin[2\times(1-c)\times\pi]\}^2}$$

$$SNR = \frac{A^2}{2\sigma^2}\frac{N\times 2\times(1-c)}{\{2\times\sigma_R\times N\times\sin[2\times(1-c)\times\pi]\}^2}.$$

A signal-to-noise ratio SNR of the target sinusoidal signal is calculated and obtained, wherein A denotes the peak value for the sinusoidal signal, σ denotes the Noise RMS for the signal, and then Step ix' is entered. In practical applications, it is not limited to the above four formulas, and possibilities for expressing by other formulas also exist.

In Step ix', the value for j is updated by adding 1, and Step ii' is returned to.

In the actual execution of the above design method for target sinusoidal analog signals, the specific operations can refer to FIG. 6, and FIG. 6 is divided into an upper portion and a lower portion, the upper portion is a measured electrical signal (the horizontal ordinate T denotes time instant, the longitudinal coordinate voltage denotes a measured electrical signal voltage), and the lower portion is an integration waveform of the measured signal. $T_{si}$ in the drawing denotes the integration starting time instant, $T_{ei}$ denotes the integration ending time instant, and $T_{zi}$ denotes the zero-crossing point obtained by calculation. $T_{si}$ denotes the calculated and obtained integration starting time instant, and the calculation formula is $T_{si}=T_{z(i-1)}+(T_{z(i-1)}-T_{z(i-2)})\times 0.89$, that is, c=0.89, $T=(T_{z(i-1)}-T_{z(i-2)})$, and $T=(T_{z(i-1)}-T_{z(i-3)})/2$ is recommended to be utilized. Also, following means can be utilized, when calculating the integration starting time instant, the number of zero-crossing points obtained previously is determined. In a case where merely two zero-crossing points are obtained previously, $T=(T_{z(i-1)}-T_{z(i-2)})$ is utilized; in a case where the zero-crossing points obtained previously are greater than two, $T=(T_{z(i-1)}-T_{z(i-3)})/2$ can also be utilized. The schematic diagram of integrating and calculating the zero-crossing point at a certain zero-crossing point after the electrical signal passes through the positive peak value is omitted.

With reference to FIG. 7, FIG. 8 and FIG. 9, FIG. 7, FIG. 8, and FIG. 9 are all divided into upper and lower two portions, the upper portion is a measured electrical signal, and the lower portion is an integration waveform of a measured signal. FIG. 7 illustrates two zero-crossing points $T_{Z1}$, $T_{Z2}$ obtained by using the traditional zero-crossing point comparison means, $T_{S3}$ is obtained by calculating $T_{Z1}$ and $T_{Z2}$, then the integration starts at $T_{S3}$, the integration is terminated at $T_{E3}$, and eventually $T_{Z3}$ is obtained by calculating $T_{S3}$ and $T_{E3}$. A schematic diagram of integrating and obtaining the third zero-crossing point after the electric signal crosses the positive peak value is omitted. FIG. 8 is a schematic diagram of an analog integration, after a measured electrical signal passes through a negative peak value, that is, the integration is performed once per period and a signal period is calculated. $T_{S10}$ and $T_{S11}$ in FIG. 8 are calculated and obtained integration starting time instants, $T_{E10}$ and $T_{E11}$ are corresponding integration ending time instants, and $T_{Z10}$ and $T_{Z11}$ are calculated and obtained 10-th and 11-th zero-crossing points. FIG. 9 illustrates a schematic diagram of an analog integration, after a measured electrical signal passes a positive peak value, that is, the integration is performed once per period and a signal period is calculated. $T_{S10}$ and $T_{S11}$ in FIG. 9 are calculated and obtained integration starting time instants, $T_{E10}$ and $T_{E11}$ are corresponding integration ending time instants, and $T_{Z10}$ and $T_{Z11}$ are calculated and obtained 10-th and 11-th zero-crossing points.

The detailed descriptions of the implementations of the present disclosure are provided above in conjunction with the accompanying drawings, but the present disclosure is not limited to the above implementations, and various variations can be made within the knowledge scope of an ordinary person skilled in the art without departing from the purpose of the present disclosure.

What is claimed is:

1. A method for measuring a Noise RMS of a periodic signal, used to obtain a noise of a target periodic signal, wherein the target periodic signal is a target periodic digital signal obtained by sampling, by an analog-to-digital converter, an analog periodic signal, and comprises following steps:

Step A, sampling, by the analog-to-digital converter, the analog periodic signal, to obtain a sampled signal, and then entering Step B;

Step B, obtaining, through an analog means or a digital means, a continuous zero-crossing time series $T_{z1}, \ldots, T_{zk}, \ldots, T_{zK}$ of at least two periods on the sampled signal after passing a negative peak value or a positive peak value, wherein K denotes a number of zero-crossing time instants in the continuous zero-crossing time series, and $T_{zk}$ denotes a k-th zero-crossing time instant in the continuous zero-crossing time series; and then initializing j=K+1 and entering Step C;

Step C, calculating and obtaining, according to $T_{z(j-1)}, \ldots, T_{z(j-m)}$, an average period T, and further calculating and obtaining, according to a preset parameter c that satisfies a value range (0.5,1), a digital initial integration point time instant $T_{sj}$ corresponding to a j-th zero-crossing time instant $T_{zj}$ through $T_{sj}=T_{z(j-1)}+T\times c$, and then entering Step D, wherein $1<m<j$, $T_{zj}$ denotes the j-th zero-crossing time instant;

Step D, selecting, on a basis of each sampling point on a sampling signal, two sampling points that are adjacent front and back to the digital initial integration point time instant $T_{sj}$, and sequentially forming a first sampling point to be analyzed, and a second sampling point to be analyzed, forming, by combining a time instant corresponding to the sampling point and a sampling value corresponding to the sampling point, a coordinate of the sampling point to be analyzed, and then entering Step E;

Step E, obtaining, according to the digital initial integration point time instant $T_{sj}$, a sampling value $x_{sj}$ corresponding to $T_{sj}$ and at a position between a first sampling point and a second sampling point through a rectangular interpolation means or a trapezoidal interpolation means, to form a coordinate $(T_{sj}, x_{sj})$ of a digital integration starting point, and then initializing V=2, sequentially defining each sampling points after the first sampling point and the second sampling point on the sampling signal as the sampling point to be analyzed, and entering Step F;

Step F, executing a digital integration operation on the sampling signal from a coordinate position of the digital integration starting point to a coordinate position of a v-th sampling point to be analyzed, to form a digital integration result Sy; and executing a digital integration operation on the sampling signal from a coordinate position of the digital integration starting point to a coordinate position of a v+1-th sampling point to be analyzed, to form a digital integration result $S_{v+1}$, and then entering Step G;

Step G, determining whether a product of the digital integration result $S_v$ and the digital integration result $S_{v+1}$ is greater than 0, updating, in a case of yes, a value for v by adding 1 and returning to Step F; otherwise, entering Step H;

Step H, obtaining, according to a condition that a sum of a digital integration from the digital integration starting point to an digital integration ending point is zero, a coordinate ($T_{ej}$, $x_{ej}$) of an digital integration ending point located between the v-th sampling point to be analyzed and the v+1-th sampling point to be analyzed through the rectangular interpolation means or the trapezoidal interpolation means, and then entering Step I;

Step I, obtaining, according to $$T_{zj} = \frac{T_{sj} + T_{ej}}{2},$$

the j-th zero-crossing time instant $T_{zj}$, and then entering Step J;

Step J, executing, according to a preset time constant $T_C$ that is not greater than a period value for the target periodic signal, following steps on the zero-crossing time instant $T_{zj}$, obtaining a signal voltage value $V_j$ at a time instant $T_{zj}+T_C$, constructing or updating a signal voltage value series $\{V_{K+1}, \ldots, V_j\}$, and then entering Step K;

steps: obtaining a signal voltage value $V_j$ corresponding to a time instant $T_{zj}+T_C$ position on the target periodic signal for an analog-to-digital conversion; or obtaining a signal voltage value $V_j$ corresponding to a sampled time instant $T_{zj}+T_C$ position on the target periodic signal after the analog-to-digital conversion; or obtaining a signal voltage value $V_j$ corresponding to a time instant position adjacent to and closest to a time instant $T_{zj}+T_C$ position on the target periodic signal after an analog-to-digital conversion; or obtaining, by selecting signal voltage values corresponding to an adjacent time instant positions respectively on both sides of a time instant $T_{zj}+T_C$ position on the target periodic signal after the analog-to-digital conversion, a signal voltage value $V_j$ at the time instant $T_{zj}+T_C$ position through a linear interpolation;

Step K, determining, whether a length of the signal voltage value series $\{V_{K+1}, \ldots, V_j\}$ is less than a preset threshold n, entering, in a case of yes, Step L; otherwise, selecting latest generated n signal voltage values from the signal voltage value series $\{V_{K+1}, \ldots, V_j\}$, and through a following formula:

$$V_{noisePower,j} = \sqrt{\frac{\sum_{l=j-(n-1)}^{j} \left(V_l - \overline{V}\right)^2}{n}},$$

obtaining a target periodic signal noise $V_{noisePower,j}$, wherein $\overline{V}$ denotes an average voltage value for the n signal voltage values that are selected to participate in a calculation, and then entering Step L; and Step L, updating, by adding 1, a value for j, and returning to Step C.

2. The method for measuring the Noise RMS of the periodic signal according to claim 1, wherein in Step C, according to $T_{z(j-1)}, \ldots, T_{z(j-m)}$, the average period T is calculated and obtained through $$T = \frac{T_{z(j-1)} - T_{z(j-m)}}{m-1}.$$

3. The method for measuring the Noise RMS of the periodic signal according to claim 1, wherein in Step A, the target periodic signal is sampled by adopting an equal time interval sampling means or an unequal time interval sampling means to obtain the sampled signal.

4. The method for measuring the Noise RMS of the periodic signal according to claim 1, wherein in Step A, a whole period sampling is executed on the target periodic signal to obtain the sampled signal.

5. The method for measuring the Noise RMS of the periodic signal according to claim 1, wherein in Step F, the digital integration operation is either a trapezoidal integration or a rectangular integration.

6. A method for measuring a Noise RMS of a periodic signal, used to obtain a noise of a target periodic signal, wherein the target periodic signal is a target periodic analog signal, and comprises following steps:

Step i, obtaining, through an analog means or a digital means, a continuous zero-crossing time series $T_{z1}, \ldots, T_{zk}> \ldots, T_{zK}$ of at least two periods on the sampled signal after passing a negative peak value or a positive peak value, wherein K denotes a number of zero-crossing time instants in the continuous zero-crossing time series, and $T_{zk}$ denotes a k-th zero-crossing time instant in the continuous zero-crossing time series; and then initializing j=K+1 and entering Step ii;

Step ii, calculating and obtaining, according to $T_{z(j-1)}, \ldots, T_{z(j-m)}$, an average period T, and further calculating and obtaining, according to a preset parameter c that satisfies a value range (0.5,1), a digital initial integration point time instant $T_{sj}$ corresponding to a j-th zero-crossing time instant $T_{zj}$ through $T_{sj}=T_{z(j-1)}+T\times c$, and then entering Step iii, wherein $1<m<j$, $T_{zj}$ denotes the j-th zero-crossing time instant;

Step iii, initializing, before the time instant $T_{sj}$, an integrator, to return an integrator output voltage to zero, and starting an analog integration at a digital integration starting point time instant $T_{sj}$, wherein the analog integration is implemented by utilizing an operational amplifier or other devices with integration functions, terminating, in a case where the integrator output voltage returns to zero again, the integration, and recording an integration ending point time instant $T_{ej}$, and then entering Step iv;

Step iv, obtaining, according to $$T_{zj} = \frac{T_{sj} + T_{ej}}{2},$$

the j-th zero-crossing time instant $T_{zj}$, and then entering Step v;

Step v, executing, according to a preset time constant $T_C$ that is not greater than a period value for the target periodic signal, following steps on the zero-crossing time instant $T_{zj}$, obtaining a signal voltage value Vat a time instant $T_{zj}+T_C$, constructing or updating a signal voltage value series $\{V_{K+1}, \ldots, V_j\}$, and then entering Step vi;

steps: obtaining a signal voltage value $V_j$ corresponding to a time instant $T_{zj}+T_C$ position on the target periodic signal for an analog-to-digital conversion; or obtaining a signal voltage value $V_j$ corresponding to a sampled time instant $T_{zj}+T_C$ position on the target periodic signal after the analog-to-digital conversion; or obtaining a signal voltage value $V_j$ corresponding to a time instant position adjacent to and closest to a time instant $T_{zj}+T_C$ position on the target periodic signal after an analog-to-digital conversion; or obtaining, by selecting signal voltage values corresponding to an adjacent time instant positions respectively on both sides of a time instant $T_{zj}+T_C$ position on the target periodic signal after the analog-to-digital conversion, a signal voltage value $V_j$ at the time instant $T_{zj}+T_C$ position through a linear interpolation;

Step vi, determining, whether a length of the signal voltage value series $\{V_{K+1}, \ldots, V_j\}$ is less than a preset threshold n, entering, in a case of yes, Step vii; otherwise, selecting latest generated n signal voltage values from the signal voltage value series $\{V_{K+1}, \ldots, V_j\}$, and through a following formula:

$$V_{noisePower,j} = \sqrt{\frac{\sum_{l=j-(n-1)}^{j} (V_l - \overline{V})^2}{n}},$$

obtaining a target periodic signal noise $V_{noisePower,j}$, wherein $\overline{V}$ denotes an average voltage value for the n signal voltage values that are selected to participate in a calculation, and then entering Step vii; and Step vii, updating, by adding 1, a value for j, and returning to Step ii.

7. The method for measuring the Noise RMS of the periodic signal according to claim 6, wherein in Step ii, according to $T_{z(j-1)}, \ldots, T_{z(j-m)}$, the average period T is calculated and obtained through $$T = \frac{T_{z(j-1)} - T_{z(j-m)}}{m-1}.$$

8. The method for measuring the Noise RMS of the periodic signal according to claim 6, wherein after respectively obtaining the digital integration starting point time instant $T_{sj}$ and the digital integration ending point time instant $T_{ej}$, $T_{sj}$ and $T_{ej}$ are respectively calibrated and updated according to circuit delay parameters.

* * * * *